(12) United States Patent
Nakagawa et al.

(10) Patent No.: US 10,269,603 B2
(45) Date of Patent: Apr. 23, 2019

(54) SUBSTRATE PROCESSING APPARATUS, GAS-PURGING METHOD, METHOD FOR MANUFACTURING SEMICONDUCTOR DEVICE, AND RECORDING MEDIUM CONTAINING ABNORMALITY-PROCESSING PROGRAM

(71) Applicant: HITACHI KOKUSAI ELECTRIC INC., Tokyo (JP)

(72) Inventors: Yoshihiko Nakagawa, Toyama (JP); Hiroshi Kotani, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 532 days.

(21) Appl. No.: 14/903,072

(22) PCT Filed: Jul. 2, 2014

(86) PCT No.: PCT/JP2014/067669
§ 371 (c)(1),
(2) Date: Jan. 6, 2016

(87) PCT Pub. No.: WO2015/005192
PCT Pub. Date: Jan. 15, 2015

(65) Prior Publication Data
US 2016/0189993 A1    Jun. 30, 2016

(30) Foreign Application Priority Data

Jul. 9, 2013  (JP) .................................. 2013-143683

(51) Int. Cl.
*C23C 16/52* (2006.01)
*H01L 21/67* (2006.01)
(Continued)

(52) U.S. Cl.
CPC ...... *H01L 21/67389* (2013.01); *C23C 16/455* (2013.01); *C23C 16/52* (2013.01);
(Continued)

(58) Field of Classification Search
None
See application file for complete search history.

(56) References Cited

U.S. PATENT DOCUMENTS 6,224,679 B1 *  5/2001  Sasaki ....................... B08B 5/00
                                                         118/719
2004/0168742 A1 *  9/2004  Kim .................. H01L 21/67017
                                                          141/98
(Continued)

FOREIGN PATENT DOCUMENTS

JP    2009-038073 A    2/2009
JP    2009-038074 A    2/2009
(Continued)

OTHER PUBLICATIONS

Japanese Office Action dated Sep. 29, 2016 in the Japanese Application No. 2015-526281.

*Primary Examiner* — Karla A Moore
(74) *Attorney, Agent, or Firm* — Volpe and Koenig, P.C.

(57) ABSTRACT

A substrate processing apparatus includes a process chamber configured to process a substrate, a carrier mounting part configured to mount a carrier which accommodates the substrate, the substrate capable of being brought into and out of the carrier when a door of the carrier mounted on the carrier mounting part is opened, a carrier opener configured to open and close the door of the carrier mounted on the carrier mounting part, a purge gas supply part configured to supply an inert gas into the carrier with the door kept opened, and a control part configured to perform control so
(Continued)

as to carry out at least one inert gas purge among a load purge, an unload purge and a standby purge.

14 Claims, 7 Drawing Sheets

(51) Int. Cl.
    *C23C 16/455*     (2006.01)
    *H01L 21/673*     (2006.01)
    *H01L 21/677*     (2006.01)

(52) U.S. Cl.
    CPC .. *H01L 21/67253* (2013.01); *H01L 21/67353* (2013.01); *H01L 21/67763* (2013.01); *H01L 21/67772* (2013.01)

(56) References Cited

U.S. PATENT DOCUMENTS

2009/0035099 A1    2/2009    Okabe et al.
2009/0035100 A1    2/2009    Okabe et al.
2009/0044749 A1    2/2009    Ozaki et al.
2009/0175709 A1*    7/2009    Okabe ............... H01L 21/67017
                                                                                                                                               414/222.02
2010/0290888 A1    11/2010    Okabe et al.
2012/0258570 A1    10/2012    Shirakawa
2013/0000757 A1*    1/2013    Yoshimura ........ H01L 21/67772
                                                                                                                                               137/561 R

FOREIGN PATENT DOCUMENTS

| | | |
|---|---|---|
| JP | 2009-065113 A | 3/2009 |
| JP | 2009-111404 A | 5/2009 |
| JP | 2009-212282 A | 9/2009 |
| JP | 2012-231117 A | 11/2012 |
| JP | 2013-120760 A | 6/2013 |
| WO | 2010/137556 A1 | 2/2010 |

* cited by examiner

FIG. 5

| | A | B | C | D | E | F | G | H | J | K |
|---|---|---|---|---|---|---|---|---|---|---|
| (a) Presence or absence of N$_2$ purge function as system | Absent | Present | | | | | | | | |
| (b) Presence or absence of N$_2$ purge function of LPn | Regardless of the presence or absence and the time setting | Absent | Present | | | | | | | |
| (c) Load purge time | | Regardless of the presence or absence and the time setting | 0 | Other than 0 | 0 | Other than 0 | | | | |
| (d) Presence or absence of standby purge | | | | Absent | Present | | Absent | | Present | |
| (e) Unload purge time | | | 0 | Other than 0 | 0 | Other than 0 | 0 | Other than 0 | 0 | Other than 0 |
| Load purge | × | × | × | × | × | × | ○ | ○ | ○ | ○ |
| Standby purge | × | × | × | × | ○ | ○ | × | × | ○ | ○ |
| Unload purge | × | × | × | ○ | × | ○ | × | ○ | × | ○ |

FIG. 6

| Carrier ID Authentication |
|---|

Please confirm a carrier ID.
If necessary, please change a carrier ID and press [Yes].
Please press [No] if you wish to cancel a carrier.

Carrier ID [                    ]

Lot ID [                    ]

Carrier Attribute
● Product  ○ Dummy $N_2$ Purge
● Perform  ○ Not perform

[ Yes ]  [ No ]  [ Cancel ]

FIG. 7

| Load port state | Anomaly factor | Processing |
|---|---|---|
| Carrier waiting state | Pressure abnormality | Load port is automatically shifted to maintenance mode (Loading of carrier suppressed) |
| | Flow rate abnormality | Load port is automatically shifted to maintenance mode (Loading of carrier suppressed) |
| | Interlock occurrence | Only alarm is generated |
| | Purge switch off | Only alarm is generated |
| Pre-door-opening state | Pressure abnormality | After automatically discharging carrier, load port is automatically shifted to maintenance mode (Loading of carrier suppressed) |
| | Flow rate abnormality | After automatically discharging carrier, load port is automatically shifted to maintenance mode (Loading of carrier suppressed) |
| | Interlock occurrence | Carrier is automatically discharged |
| | Purge switch off | Carrier is automatically discharged |
| Load purge ongoing state | Pressure abnormality | After closing door and automatically discharging carrier, load port is automatically shifted to maintenance mode (Loading of carrier suppressed) |
| | Flow rate abnormality | After closing door and automatically discharging carrier, load port is automatically shifted to maintenance mode (Loading of carrier suppressed) |
| | Interlock occurrence | Door is closed and carrier is automatically discharged |
| | Purge switch off | Door is closed and carrier is automatically discharged |
| Standby purge ongoing state | Pressure abnormality | After closing door and automatically discharging carrier, load port is automatically shifted to maintenance mode (Loading of carrier suppressed) |
| | Flow rate abnormality | After closing door and automatically discharging carrier, load port is automatically shifted to maintenance mode (Loading of carrier suppressed) |
| | Interlock occurrence | Door is closed and carrier is automatically discharged |
| | Purge switch off | Door is closed and carrier is automatically discharged |
| Unload purge ongoing state | Pressure abnormality | After closing door and automatically discharging carrier, load port is automatically shifted to maintenance mode (Loading of carrier suppressed) |
| | Flow rate abnormality | After closing door and automatically discharging carrier, load port is automatically shifted to maintenance mode (Loading of carrier suppressed) |
| | Interlock occurrence | Door is closed and carrier is automatically discharged |
| | Purge switch off | Door is closed and carrier is automatically discharged |
| Post-door-closing state | Pressure abnormality | After automatically discharging carrier, load port is automatically shifted to maintenance mode (Loading of carrier suppressed) |
| | Flow rate abnormality | After automatically discharging carrier, load port is automatically shifted to maintenance mode (Loading of carrier suppressed) |
| | Interlock occurrence | Carrier is automatically discharged |
| | Purge switch off | Carrier is automatically discharged |
| Post-carrier-unloading state | Pressure abnormality | Load port is automatically shifted to maintenance mode (Loading of carrier suppressed) |
| | Flow rate abnormality | Load port is automatically shifted to maintenance mode (Loading of carrier suppressed) |
| | Interlock occurrence | Only alarm is generated |
| | Purge switch off | Only alarm is generated |

US 10,269,603 B2

SUBSTRATE PROCESSING APPARATUS, GAS-PURGING METHOD, METHOD FOR MANUFACTURING SEMICONDUCTOR DEVICE, AND RECORDING MEDIUM CONTAINING ABNORMALITY-PROCESSING PROGRAM

TECHNICAL FIELD

The present disclosure relates to a technique of suppressing the exposure to an air atmosphere of a substrate accommodated within a substrate accommodating container carried into a substrate processing apparatus which processes a substrate, e.g., a semiconductor wafer or the like.

BACKGROUND

For example, as illustrated in FIG. 1, there is available a substrate processing apparatus in which a plurality of load ports LP1 to LP3 for mounting carriers CA1 to CA3 as wafer accommodating containers, an atmospheric pressure transfer chamber EFEM including an atmospheric pressure robot AR for transferring a substrate under an air atmosphere, a plurality of load lock chambers LM1 to LM2 capable of switching an atmospheric state and a vacuum state, a vacuum transfer chamber TM including a vacuum robot VR for transferring a substrate in the vacuum state, and a plurality of process chambers PM1 to PM4 as substrate process chambers are disposed in the named order. FIG. 1 is a view of the substrate processing apparatus viewed from the upper side.

In this substrate processing apparatus, for example, the carrier CA1 which accommodates a plurality of wafers W is mounted on the load port LP1. After the door CAH1 of the carrier CA1 is opened, the wafers W are transferred to the load lock chamber LM1 via the atmospheric pressure transfer chamber EFEM by the atmospheric pressure robot AR under the air atmosphere. Then, after the load lock chamber LM1 is brought into the vacuum state by closing a gate valve LD1, the wafers W existing within the load lock chamber LM1 are transferred to the process chamber PM1 via the vacuum transfer chamber TM by the vacuum robot VR. The wafers W subjected to substrate processing such as deposition or the like within the process chamber PM1 are returned to the carrier CA1 on the load port. LP1 in the reverse order.

At this time, the wafers W existing within the carrier CA1 are exposed to the air atmosphere. Thus, impurities or moisture contained in the air atmosphere adhere to the wafers W. This adversely affects the substrate processing performed within the process chamber PM1.

The present disclosure provides a substrate processing technique capable of suppressing the exposure to an air atmosphere of substrates accommodated within a substrate accommodating container.

SUMMARY

According to one aspect of the present disclosure, there is provided a substrate processing apparatus including:

a process chamber configured to process a substrate;

a carrier mounting part configured to mount a carrier which accommodates the substrate, the substrate capable of being brought into and out of the carrier when a door of the carrier mounted on the carrier mounting part is opened;

a carrier opener configured to open and close the door of the carrier mounted on the carrier mounting part;

a purge gas supply part configured to supply an inert gas into the carrier with the door kept opened; and a control part configured to perform control so as to carry out at least one inert gas purge among a load purge which is an inert gas purge in which the inert gas is supplied from the purge gas supply part into the carrier for a predetermined time after the door of the carrier is opened by the carrier opener, an unload purge which is an inert gas purge in which the inert gas is supplied from the purge gas supply part into the carrier for a predetermined time after the substrate processed in the process chamber is accommodated within the carrier and before the door is closed, and a standby purge which is an inert gas purge in which the inert gas is supplied from the purge gas supply part into the carrier during a standby time zone between a time zone of the load purge and a time zone of the unload purge.

According to another aspect of the present disclosure, there is provided a gas-purging method including:

a door opening process of opening a door of a carrier which accommodates a substrate;

a designation process of designating at least one inert gas purge among a load purge which is an inert gas purge in which an inert gas is supplied into the carrier for a predetermined time after the door is opened in the door opening process, an unload purge which is an inert gas purge in which the inert gas is supplied into the carrier for a predetermined time after a processed substrate is accommodated within the carrier and before the door is closed, and a standby purge which is an inert gas purge in which the inert gas is supplied into the carrier during a standby time zone between a time zone of the load purge and a time zone of the unload purge; and a supply process of supplying the inert gas into the carrier by carrying out the inert gas purge designated in the designation process.

According to another aspect of the present disclosure, there is provided a method for manufacturing a semiconductor device, including:

a door opening process of opening a door of a carrier which accommodates a substrate;

a designation process of designating at least one inert gas purge among a load purge which is an inert gas purge in which an inert gas is supplied into the carrier for a predetermined time after the door is opened in the door opening process, an unload purge which is an inert gas purge in which the inert gas is supplied into the carrier for a predetermined time after a substrate processed in a process chamber for performing substrate processing is accommodated within the carrier and before the door is closed, and a standby purge which is an inert gas purge in which the inert gas is supplied into the carrier during a standby time zone between a time zone of the load purge and a time zone of the unload purge;

a supply process of supplying the inert gas into the carrier by carrying out the inert gas purge designated in the designation process;

a processing process of loading the substrate from the carrier into the process chamber and processing the substrate within the process chamber; and a substrate accommodating process of unloading the processed substrate from an interior of the process chamber and accommodating the processed substrate within the carrier.

According to another aspect of the present disclosure, there is provided a recording medium which stores an abnormality-processing program including:

a designation step of designating at least one inert gas purge among a load purge which is an inert gas purge in which an inert gas is supplied into a carrier for a predetermined time after a door of the carrier for accommodating a substrate is opened, an unload purge which is an inert gas purge in which the inert gas is supplied into the carrier for a predetermined time after a processed substrate is accommodated within the carrier and before the door is closed, and a standby purge which is an inert gas purge in which the inert gas is supplied into the carrier during a standby time zone between a time zone of the load purge and a time zone of the unload purge;

a supply step of supplying the inert gas from a purge gas supply pipe into the carrier by carrying out the inert gas purge designated at the designation step;

a step of, at the supply step, detecting a gas pressure within the purge gas supply pipe by a pressure sensor installed in the purge gas supply pipe and measuring a gas flow rate within the purge gas supply pipe by a flow meter installed in the purge gas supply pipe; and an abnormality determination step of determining that an abnormality has occurred if the pressure detected by the pressure sensor deviates from a predetermined threshold value or if the flow rate measured by the flow meter deviates from a predetermined threshold value.

According to the configurations of the present disclosure, it is possible to suppress the exposure of substrates accommodated within a substrate accommodating container to an air atmosphere.

BRIEF DESCRIPTION OF THE DRAWINGS

FIG. 5 is a view illustrating purge processing combinations according to an embodiment of the present disclosure.

FIG. 6 illustrates an example of an operation screen used in carrier ID authentication according to an embodiment of the present disclosure.

FIG. 7 is a view illustrating an abnormality coping process in a control part at the time of occurrence of an abnormality in a purge gas supply part or the like in an embodiment of the present disclosure.

DETAILED DESCRIPTION (1) Configuration of Substrate Processing Apparatus

Figure 1:
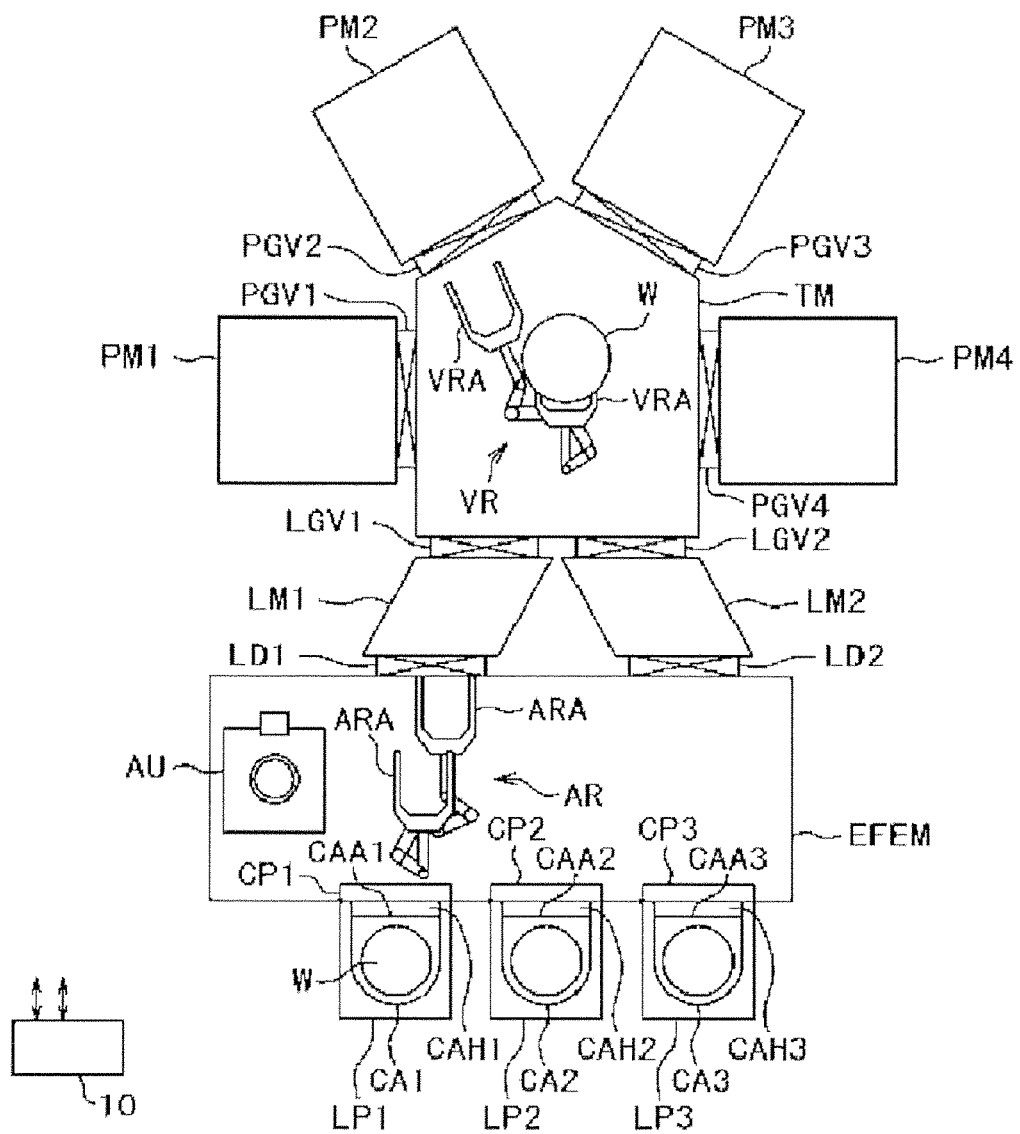
FIG. 1 is a configuration view (top view) of a substrate processing apparatus according to an embodiment of the present disclosure.
Figure 2:
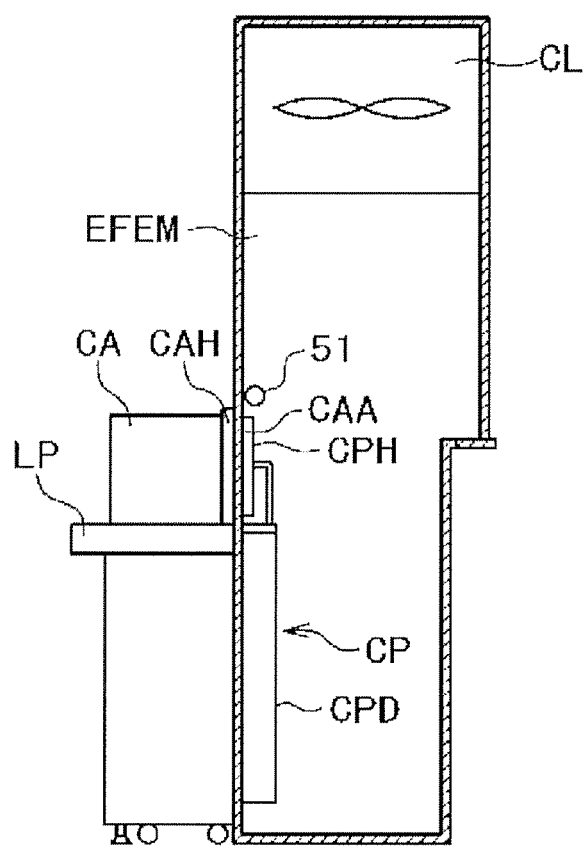
FIG. 2 is a partial side view of the substrate processing apparatus according to an embodiment of the present disclosure.

A substrate processing apparatus according to an embodiment of the present disclosure will now be described with reference to the drawings. In the present embodiment, the substrate processing apparatus is configured as, for example, a semiconductor manufacturing device which carries out a processing process in a method for manufacturing a semiconductor device (IC: Integrated Circuit). Furthermore, the substrate processing apparatus of the present embodiment is configured as a single-substrate apparatus which performs a deposition process such as a CVD (Chemical Vapor Deposition) process or the like to a single substrate within a single process chamber. FIG. 1 is a configuration view of the substrate processing apparatus according to an embodiment of the present disclosure, which is viewed from the upper side. FIG. 2 is a partial side view of the substrate processing apparatus according to an embodiment of the present disclosure.

Figure 3:
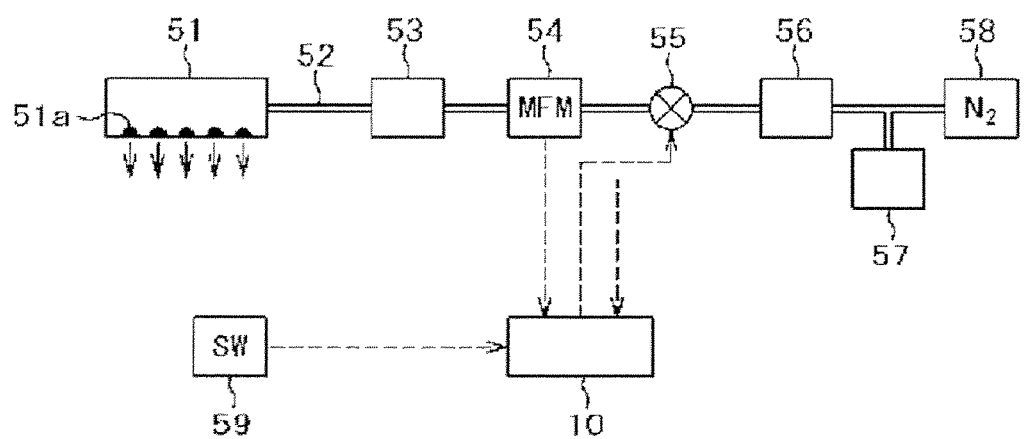
FIG. 3 is a configuration view of a purge gas supply part according to an embodiment of the present disclosure.

FIG. 3 is a configuration view of a purge gas supply part according to an embodiment of the present disclosure.

The substrate processing apparatus illustrated in FIG. 1 includes a vacuum side configuration in which a substrate (e.g., a wafer W made of silicon or the like) is handled in a reduced pressure state and an atmospheric pressure side configuration in which a wafer W is handled in an atmospheric pressure state. The vacuum side configuration mainly includes a vacuum transfer chamber TM, load lock chambers LM1 and LM2 and process chambers PM1 to PM4 which process wafers W. The atmospheric pressure side configuration mainly includes an atmospheric pressure transfer chamber EFEM and load ports LP1 to LP3. Carriers CA1 to CA3 which accommodate wafers W are transferred from the outside of the substrate processing apparatus and are mounted on the load ports LP1 to LP3. Furthermore, the carriers CA1 to CA3 are transferred to the outside of the substrate processing apparatus. By this configuration, for example, an unprocessed wafer W is taken out from the carrier CA1 on the load port LP1 and is carried into the process chamber PM1 via the load lock chamber LM1. After the wafer W is processed in the process chamber PM1, the processed wafer W is returned to the carrier CA1 on the load port LP1 in the reverse order.

(Vacuum Side Configuration)

The vacuum transfer chamber TM is configured to have a vacuum-tight structure capable of withstanding a negative pressure (a reduced pressure) lower than an atmospheric pressure such as a vacuum state or the like. In the present embodiment, the housing of the vacuum transfer chamber TM has a pentagonal shape in a plane view and is formed in a box-like shape with the upper and lower ends closed. The load lock chambers LM1 and LM2 and the process chambers (process chambers) PM1 to PM4 are disposed so as to surround the outer periphery of the vacuum transfer chamber TM. The process chambers PM1 to PM4 will be generically or representatively referred to as a process chamber PM. The load lock chambers LM1 and LM2 will be generically or representatively referred to as a load lock chamber LM.

For example, one vacuum robot VR as a transfer means for transferring the wafer W in a reduced pressure state is installed within the vacuum transfer chamber TM. The vacuum robot VR puts the wafers W on two substrate support arms (hereinafter referred to as arms) VRA which are substrate placement parts. In this way, the vacuum robot VR performs the transfer of the wafers W between the load lock chambers LM1 and LM2 and the process chambers PM1 to PM4. The vacuum robot VR is configured to move up and down while maintaining the air-tightness of the vacuum transfer chamber TM. The two arms VRA are installed in a vertically spaced-apart relationship and are configured to extend and retract in a horizontal direction and to rotationally move within a horizontal plane.

Each of the process chambers PM1 to PM4 includes a substrate mounting part on which the wafer W is mounted. Each of the process chambers PM1 to PM4 is configured as, for example, a single-substrate-type process chamber which processes the wafers W one by one in a reduced pressure state. That is to say, each of the process chambers PM1 to PM4 serves as a process chamber which gives an added value to the wafers W by performing, for example, etching or ashing using plasma or the like, deposition (CVD) using a chemical reaction, and so forth.

Furthermore, each of the process chambers PM1 to PM4 includes various kinds of configurations corresponding to the functions thereof, for example, a gas introduction mechanism, an exhaust mechanism, a pressure regulating mechanism, a temperature control mechanism, a plasma discharge mechanism and the like (all of which are not illustrated). These mechanisms include a mass flow controller (MFC) (not illustrated) which controls the flow rate of a process gas supplied into each of the process chambers PM1 to PM4, a pressure controller 15 such as an auto pressure controller (APC) or the like which controls the internal pressure of each of the process chambers PM1 to PM4, a temperature controller (not illustrated) which controls the internal temperature of each of the process chambers PM1 to PM4, a valve digital I/O 19 which controls the on/off operation of a valve for the supply and exhaust of a process gas, a SW digital I/O 18 which controls the on/off operation of various kinds of switches (SW), and so forth. The respective components described above are electrically connected to a process chamber controller 14. Descriptions will be made later on the configuration of a control part 10 as a device controller which includes the process chamber controller 14.

The process chambers PM1 to PM4 are respectively connected to the vacuum transfer chamber TM by gate valves PGV1 to PGV4 as on-off valves. Accordingly, by opening the gate valves PGV1 to PGV4, it is possible to perform the transfer of the wafers W between the process chambers PM1 to PM4 and the vacuum transfer chamber TM under a reduced pressure. Furthermore, by closing the gate valves PGV1 to PGV4, it is possible to perform various kinds of substrate processing with respect to the wafers W while maintaining the internal pressure of the process chambers PM1 to PM4 and the process gas atmosphere.

The load lock chambers LM1 and LM2 serve as spare chambers from which the wafers W are loaded into the vacuum transfer chamber TM or spare chambers into which the wafers W are unloaded from the interior of the vacuum transfer chamber TM. Buffer stages (not illustrated) as substrate mounting parts for temporarily supporting the wafers W when loading and unloading the wafers W are respectively installed within the load lock chambers LM1 and LM2. The buffer stages may be configured as multi-stage slots that hold a plurality of (e.g., two) wafers W.

Furthermore, the load lock chambers LM1 and LM2 are respectively connected to the vacuum transfer chamber TM by gate valves LGV1 and LGV2 as on-off valves and are respectively connected to the below-described atmospheric pressure transfer chamber EFEM by gate valves LD1 and LD2 as on-off valves. Accordingly, by opening the gate valves LD1 and LD2 existing at the side of the atmospheric pressure transfer chamber EFEM while closing the gate valves LGV1 and LGV2 existing at the side of the vacuum transfer chamber TM, it is possible to perform the transfer of the wafers W between the load lock chambers LM1 and LM2 and the atmospheric pressure transfer chamber EFEM under an atmospheric pressure while maintaining the vacuum tightness of the interior of the vacuum transfer chamber TM.

Furthermore, the load lock chambers LM1 and LM2 are configured to have a structure capable of withstanding a reduced pressure lower than an atmospheric pressure such as a vacuum state or the like. The interior of the load lock chambers LM1 and LM2 can be evacuated. Accordingly, by opening the gate valves LGV1 and LGV2 existing at the side of the vacuum transfer chamber TM after evacuating the interior of the load lock chambers LM1 and LM2 by closing the gate valves LD1 and LD2 existing at the side of the atmospheric pressure transfer chamber EFEM, it is possible to perform the transfer of the wafers W between the load lock chambers LM1 and LM2 and the vacuum transfer chamber TM under a reduced pressure while maintaining the vacuum state of the interior of the vacuum transfer chamber TM. In this way, the load lock chambers LM1 and LM2 are configured to switch the atmospheric pressure state and the reduced pressure state.

(Atmospheric Pressure Side Configuration)

At the atmospheric pressure side of the substrate processing apparatus, as described above, there are installed the atmospheric pressure transfer chamber EFEM (Equipment Front End Module), which is a front module connected to the load lock chambers LM1 and LM2, and the load ports LP1 to LP3 as carrier mounting parts connected to the atmospheric pressure transfer chamber EFEM and configured to mount the carriers CA1 to CA3 as wafer accommodating containers, each of which accommodates, e.g., 25 wafers W corresponding to one lot. For example, FOUPs (Front Opening Unified Pods) are used as the carriers CA1 to CA3.

For example, one atmospheric pressure robot AR as a transfer means is installed within the atmospheric pressure transfer chamber EFEM. The atmospheric pressure robot AR performs the transfer of the wafers W between the load lock chambers LM1 and LM2 and the carriers CA1 to CA3 mounted on the load ports LP1 to LP3. Similar to the vacuum robot VR, the atmospheric pressure robot AR includes two arms ARA which are substrate mounting parts.

Carrier doors CAH1 to CAH3, which are caps (lids) of the carriers CA1 to CA3, are installed in the carriers CA1 to CA3. In a state in which the doors CAH1 to CAH3 of the carriers CA1 to CA3 mounted on the load ports LP1 to LP3 are opened, the wafers W are accommodated within the carriers CA1 to CA3 via substrate loading/unloading ports CAA1 to CAA3 by the atmospheric pressure robot AR. Furthermore, the wafers W accommodated within the carriers CA1 to CA3 are unloaded by the atmospheric pressure robot AR.

Furthermore, within the atmospheric pressure transfer chamber EFEM, carrier openers CP1 to CP3 for opening and closing the carrier doors CAH1 to CAH3, respectively, are installed adjacent to the load ports LP1 to LP3. That is to say, within the atmospheric pressure transfer chamber EFEM, the carrier openers CP1 to CP3 are installed adjacent to the load ports LP1 to LP3.

In the subject specification, the load ports LP1 to LP3 will be generically or representatively referred to as a load port LP. The carriers CA1 to CA3 will generically or representatively referred to as a carrier CA. The carrier doors CAH1 to CAH3 will be generically or representatively referred to as a carrier door CAH. The substrate loading/unloading ports CAA1 to CAA3 will be generically or representatively referred to as a substrate loading/unloading port CAA. The carrier openers CP1 to CP3 will be generically or representatively referred to as a carrier opener CP.

As illustrated in FIG. 2, the carrier opener CP includes a closure CPH capable of making close contact with the carrier door CAH and a drive mechanism CPD which operates the closure CPH in the horizontal and vertical directions. The carrier opener CP opens and closes the carrier door CAH by horizontally and vertically moving the closure CPH and the cat tier door CAH in a state in which the closure CPH is brought into close contact with the carrier door CAH.

The closure CPH generically designates or represents the closures CPH1 to CPH3. The closures CPH1 to CPH3 are respectively installed so as to correspond to the carrier openers CP1 to CP3. The drive mechanism CPD generically designates or represents the drive mechanisms CPD1 to CPD3. The drive mechanisms CPD1 to CPD3 are respectively installed so as to correspond to the carrier openers CP1 to CP3.

Furthermore, within the atmospheric pressure transfer chamber EFEM, purge gas supply parts 50(1) to 50(3) for performing an inert gas purge (an $N_2$ gas purge in the present embodiment) by which a purge gas as an inert gas (an $N_2$ (nitrogen) gas in the present embodiment) is supplied and filled into the carriers CA1 to CA3 mounted on the load ports LP1 to LP3 with the carrier doors CAH1 to CAH3 kept opened, are installed so as to correspond to the load ports LP1 to LP3, respectively. In FIG. 2, for the sake of making the view easily understandable, a purge gas supply nozzle 51 to be described later is illustrated but the purge gas supply parts 50(1) to 50(3) and the atmospheric pressure robot AR other than the purge gas supply nozzle 51 are not illustrated. The purge gas supply parts 50(1) to 50(3) have the same structure. The purge gas supply parts 50(1) to 50(3) will be generically or representatively referred to as a purge gas supply part 50.

The purge gas supply part 50 according to the present embodiment will be described with reference to FIG. 3. As illustrated in FIG. 3, the purge gas supply part 50 is configured to include a purge gas supply nozzle 51 for injecting and supplying a purge gas into the carrier CA mounted on the load port LP, a purge gas supply pipe 52 connected at one end to the purge gas supply nozzle 51 and a purge gas supply source 58 connected to the other end of the purge gas supply pipe 52.

Specifically, the purge gas supply source 58, a pressure sensor 57 configured to measure the internal pressure of the purge gas supply pipe 52, a pressure regulating valve (regulator) 56 configured to regulate the flow rate of a gas flowing through the purge gas supply pipe 52 to a predetermined value, an on-off valve 55 configured to open and close the purge gas supply pipe 52, a flow meter (MFM) 54 configured to measure the flow rate of the gas flowing through the purge gas supply pipe 52, a filter 53 configured to remove foreign materials from the gas flowing through the purge gas supply pipe 52, and the purge gas supply nozzle 51 are installed in the purge gas supply pipe 52 in the named order from the upstream side. In the present embodiment, the pressure sensor 57 and the purge gas supply source 58 existing at the downstream side of the pressure sensor 57 are installed within the atmospheric pressure transfer chamber EFEM. The purge gas supply source 58 is installed outside the present substrate processing apparatus. Alternatively, the purge gas supply source 58 may be installed inside the present substrate processing apparatus. Furthermore, a purge switch 59 configured to set whether to perform an $N_2$ gas purge with respect to the carrier CA mounted on the load port LP is installed in each of the load ports LP1 to LP3.

The MFM 54, the on-off valve 55, the pressure sensor 57 and the purge switch 59 are signal-connected to a control part 10 which will be described later. The control part 10 determines whether the pressure value detected by the pressure sensor 57 falls within a predetermined threshold value range. If the pressure value does not fall within the predetermined threshold value range, namely if a pressure abnormality occurs, the control part 10 performs abnormality processing depending on the state of the load port LP. Furthermore, the control part 10 determines whether the flow rate of the gas flowing through the purge gas supply pipe 52, which is detected by the MFM 54, falls within a predetermined threshold value range. If the flow rate does not fall within the predetermined threshold value range, namely if a flow rate abnormality occurs, the control part 10 performs abnormality processing depending on the state of the load port LP. Moreover, if the purge switch 59 is set in an OFF state, the control part 10 closes the on-off valve 55 and makes it impossible to perform an $N_2$ gas purge. If the purge switch 59 is set in an ON state, the control part 10 makes it possible to open and close the on-off valve 55, namely makes it possible to perform an $N_2$ gas purge. The detailed operation of the control part 10 will be described later. A flow rate controller (MFC) for controlling the flow rate of a gas and an oxygen concentration meter may be used in place of the flow meter 54 and the pressure regulating valve 56.

As illustrated in FIG. 2, the purge gas supply nozzle 51 is installed at least at the upper side of the opening CAA of the carrier CA, namely the substrate loading/unloading port CAA of the carrier CA, within the atmospheric pressure transfer chamber EFEM. In FIG. 2, there is illustrated the cross section (circular shape) of the purge gas supply nozzle 51. The material of the purge gas supply nozzle 51 is, e.g., stainless steel. While not illustrated in FIG. 2, it is preferred that the purge gas supply nozzle 51 is also installed at the lateral side (transverse side) of the substrate loading/unloading port CAA of the carrier CA. One or more purge gas supply holes 51a for injecting a purge gas are formed in the purge gas supply nozzle 51. The purge gas supply holes 51a are formed to face toward the interior of the carrier CA so that the purge gas supply holes 51a can inject a purge gas into the carrier CA. The purge gas injected from the purge gas supply holes 51a into the carrier CA through the substrate loading/unloading port CAA is discharged from the interior of the carrier CA to the outside of the carrier CA, namely the interior of the atmospheric pressure transfer chamber EFEM, through the substrate loading/unloading port CAA.

Furthermore, as a substrate position correcting device, an aligner AU, which is an orientation flat aligning device for performing position alignment of a crystal orientation of the wafer W, is installed within the atmospheric pressure transfer chamber EFEM. When the wafer W is of a notch type, it may be possible to install a notch aligning device as the substrate position correcting device. In addition, a clean air unit CL configured to supply a clean air into the atmospheric pressure transfer chamber EFEM is installed in the atmospheric pressure transfer chamber EFEM.

In the present embodiment, the interior of the atmospheric pressure transfer chamber EFEM is kept in an air atmosphere. In this case, the atmospheric pressure transfer chamber EFEM does not become an air-tight structure. The interior of the atmospheric pressure transfer chamber EFEM communicates with the atmosphere outside the substrate processing apparatus through a gap of the housing that forms the atmospheric pressure transfer chamber EFEM. However, the present disclosure is not limited thereto. It may be possible to employ a configuration in which the interior of the atmospheric pressure transfer chamber EFEM is kept in an inert gas (e.g., $N_2$ gas) atmosphere. In this case, the atmospheric pressure transfer chamber EFEM becomes an air-tight structure and is configured so that, for example, an $N_2$ gas is injected from the upper portion of the atmospheric pressure transfer chamber EFEM into the atmospheric pressure transfer chamber EFEM and is discharged from the lower portion of the atmospheric pressure transfer chamber EFEM to the outside of the atmospheric pressure transfer chamber EFEM.

The respective load ports LP1 to LP3 are configured so that the carriers CA1 to CA3 which accommodate a plurality of wafers W are mounted on the respective load ports LP1 to LP3. Within each of the carriers CA1 to CA3, slots (not illustrated), e.g., 25 slots corresponding to one lot, are formed as accommodation portions for accommodating the wafers W. The load port LP is configured to, when the carrier CA is mounted thereon, read and store a barcode or the like which is attached to the carrier CA to indicate a carrier ID for identifying the carrier CA.

While the substrate processing apparatus of the present embodiment has been described above, the number, configuration and combination of the respective chambers are not limited to the aforementioned ones but may be appropriately selected. For example, in the aforementioned embodiment, descriptions have been made on the case where the number of the load ports LP is three. However, the number of the load ports LP is not limited to three.

(2) Configuration of Device Controller

Figure 4:
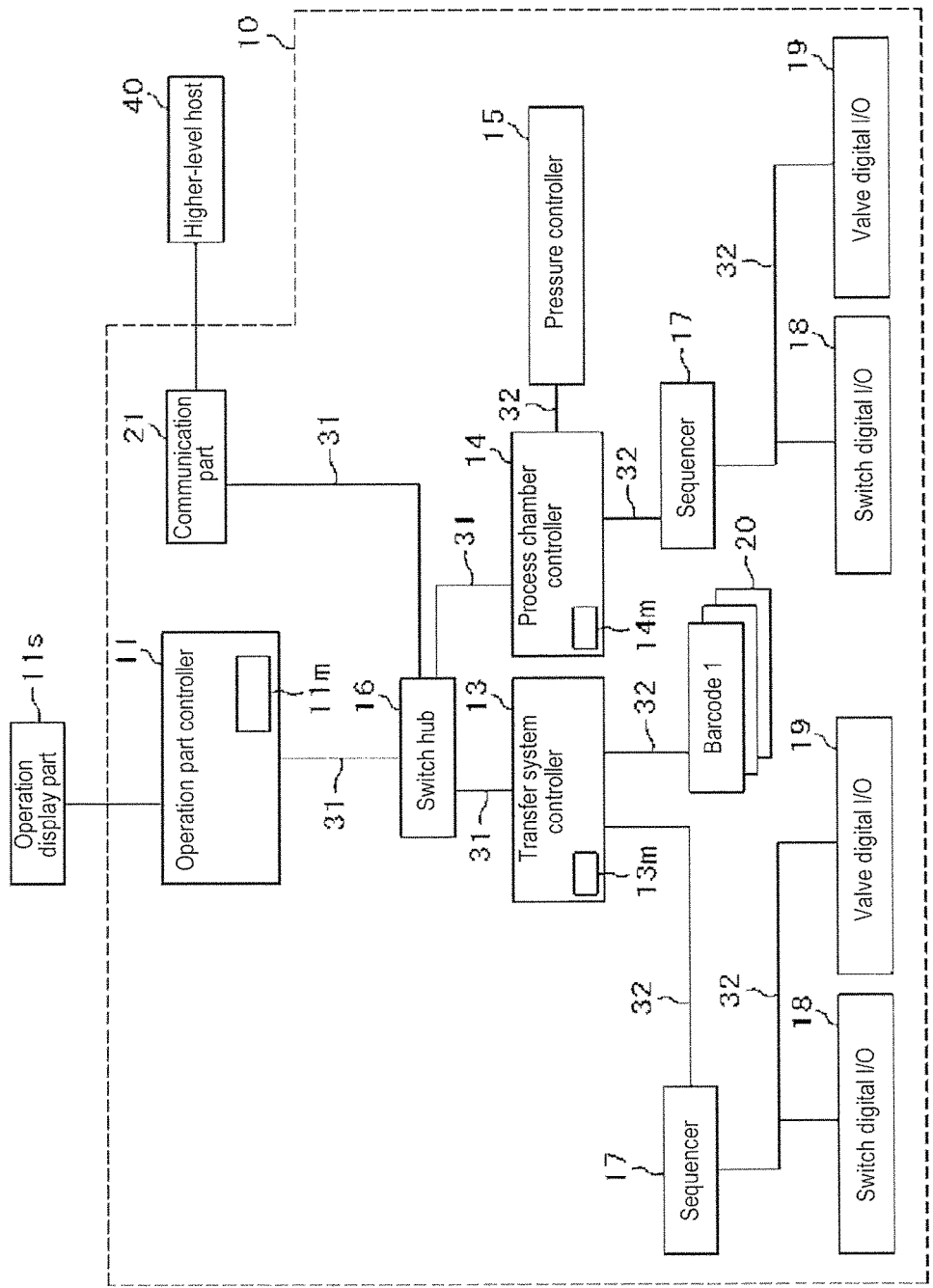
FIG. 4 is a configuration view of a control part of the substrate processing apparatus according to an embodiment of the present disclosure.

Next, the control part 10 as a device controller which controls the substrate processing apparatus will be described mainly with reference to FIG. 4. FIG. 4 is a configuration view of the control part 10 of the substrate processing apparatus. As illustrated in FIG. 4, an operation part controller 11, a transfer system controller 13 as a control means and a process chamber controller 14 as another control means are installed in the control part 10 so that they are connected to one another via a switching hub 16 by a communication network 31 such as a LAN or the like. Furthermore, a higher-level host computer 40 is connected to the control part 10 via a communication part 21 by the communication network 31 such as a LAN or the like.

The control part 10 is installed, for example, within the substrate processing apparatus. By including the operation part controller 11, the transfer system controller 13, the process chamber controller 14 and so forth, the control part 10 is configured to control the respective parts of the substrate processing apparatus. The operation part controller 11, the transfer system controller 13 and the process chamber controller 14 are respectively provided with, as hardware configurations, CPUs (Central Processing Units) and storage parts 11m, 13m and 14m which store operation programs for the respective controllers. The respective CPUs operate according to the respective operation programs. Each of the storage parts 11m, 13m and 14m is formed of an EEPROM, a flash memory, a hard disk or the like and includes a storage medium which stores the operation program of the CPU.

The control part 10 may be installed outside the substrate processing apparatus instead of being installed inside the substrate processing apparatus as mentioned above. Furthermore, the operation part controller 11, the transfer system controller 13 or the process chamber controller 14 may be configured by an ordinary general-purpose computer such as, e.g., a personal computer or the like. In this case, the respective controllers may be configured by installing programs in the general-purpose computer using a computer-readable recording medium (a flexible disk, a CD-ROM, a USB memory, a magnetic tape, a hard disk, a DVD, etc.) which stores various kinds of programs.

Furthermore, the means for supplying the programs which execute the aforementioned processing may be arbitrarily selected. Instead of supplying the programs via a predetermined recording medium as described above, it may be possible to supply the programs via, e.g., a communication line, a communication network, a communication system or the like. In this case, for example, the programs may be posted to a bulletin board of a communication network and may be supplied via a network by superimposing the programs on a carrier wave. Then, the aforementioned processing can be performed by starting up the programs thus supplied and executing the programs under the control of the OS (Operating System) of the substrate processing apparatus in a similar manner to other application programs.

The operation part controller 11 constitutes an operator interface together with an operation display part 11s connected to the operation part controller 11. The operation part controller 11 is configured to receive an operator's operation or instruction via the operation display part 11s. An operation screen and information such as various kinds of data or the like are displayed on the operation display part 11s. The data displayed on the operation display part Hs are stored in the storage part 11m of the operation part controller 11.

A valve digital I/O 19 which controls an on/off operation of a valve for the supply and exhaust of a process gas and a SW digital I/O 18 which controls on/off operations of various kinds of switches (SW) are respectively connected to the process chamber controller 14 and the transfer system controller 13 via a signal line 32 such as a Device Net or the like and via a sequencer 17. Furthermore, the process chamber controller 14 and the transfer system controller 13 are respectively provided with the storage parts 14m and 13m which store a process recipe, a transfer recipe and various kinds of programs.

The process chamber controller 14 is configured to control the substrate processing performed within the process chambers PM1 to PM4. Specifically, a pressure controller 15 such as an auto pressure controller (APC) or the like, which controls the internal pressure of the process chambers PM1 to PM4, is connected to the process chamber controller 14 via, e.g., a signal line 32. Based on, e.g., the process recipe prepared or edited by an operator via the operation part controller 11 and stored in the storage part 14m, the process chamber controller 14 outputs control data (control instructions) for the processing of the wafers W to the pressure controller 15, the valve for the supply and exhaust of a process gas, various kinds of switches, a mass flow controller, a temperature controller and the like, thereby controlling the substrate processing performed within the process chambers PM1 to PM4.

The transfer system controller 13 includes a robot controller which controls the vacuum robot VR and the atmospheric pressure robot AR and a purge gas controller which controls the injection of a purge gas ($N_2$ gas) from the purge gas supply nozzle 51 of the purge gas supply part 50. The transfer system controller 13 is configured to control the transfer of the wafers W, the supply of the purge gas injected into the carrier CA and the execution of a work instructed by an operator. Specifically, a storage part 20 for storing barcodes 1, 2, 3 . . . which indicate carrier IDs for identifying the carriers CA1 to CA3 mounted on the load ports LP1 to LP3 is connected to the transfer system controller 13 via, e.g., the signal line 32. Furthermore, the flow meter 54, the on-off valve 55, the pressure sensor 57 and the purge switch 59 are connected to the transfer system controller 13 via, e.g., the signal line 32.

Based on, e.g., the transfer recipe prepared or edited by an operator via the operation part controller 11 and stored in the storage part 13m, the transfer system controller 13 outputs control data (control instructions) for the transfer of the wafers W to the vacuum robot VR, the atmospheric pressure robot AR, various kinds of valves, switches and so forth, thereby controlling the transfer of the wafers W performed within the substrate processing apparatus. Furthermore, based on the transfer recipe and at a predetermined timing, the transfer system controller 13 performs gas purge control by which the interior of the carriers CA1 to CA3 mounted on the load ports LP1 to LP3 is purged by an inert gas (e.g., an $N_2$ gas). When performing the gas purge control or before and after performing the gas purge control, the transfer system controller 13 investigates whether an abnormality occurs in the purge gas supply part 50. If an abnormality occurs, the transfer system controller 13 performs the abnormality processing which will be described later.

The gas purge control will now be described in detail. FIG. 5 is a view illustrating purge processing combinations according to an embodiment of the present disclosure. The substrate processing apparatus of the present embodiment can select whether to give an inert gas ($N_2$ gas) purge function to the substrate processing apparatus as a system ((a) the presence or absence of an $N_2$ purge function as a system). Furthermore, selecting whether to give an inert gas ($N_2$ gas) purge function to the respective load ports LP1 to LP3 is possible ((b) the presence or absence of an $N_2$ purge function of the load port LPn). Furthermore, selecting and setting whether to perform a load purge with respect to each of the load ports LP1 to LP3 ((c) the load purge time), whether to perform a standby purge with respect to each of the load ports LP1 to LP3 ((d) the presence or absence of a standby purge) and whether to perform an unload purge with respect to each of the load ports LP1 to LP3 ((e) the unload purge time) is possible. As a result, it is possible to set 10 cases indicated by A to K in FIG. 5.

In FIG. 5, the purge processing is illustrated with respect to only the load port LPn. However, in the present embodiment, the purge processing may be set with respect to all the load ports LP1 to LP3. Furthermore, in FIG. 5, mark O means that a purge is performed and mark X means that a purge is not performed. If the purge time is 0 (zero), it is meant that a purge is not performed. If the purge time is a numerical value other than 0 (zero), it is meant that a purge is performed for the time denoted by the numerical value.

The load purge refers to an inert gas purge in which, immediately after the carrier CA is mounted on the load port LP and the carrier door CAH is opened, an inert gas (e.g., an $N_2$ gas) is injected from the purge gas supply nozzle 51 toward the interior of the carrier CA for a predetermined time (e.g., 100 seconds) to thereby substitute the internal atmosphere of the carrier CA to an inert gas ($N_2$ gas) atmosphere.

The unload purge refers to an inert gas purge in which, after the wafer W processed in the process chamber PM is returned to and accommodated within the carrier CA mounted on the load port LP and before the carrier door CAH is closed, an inert gas (e.g., an $N_2$ gas) is injected from the purge gas supply nozzle 51 toward the interior of the carrier CA for a predetermined time (e.g., 100 seconds) to thereby substitute the internal atmosphere of the carrier CA to an $N_2$ gas atmosphere. The unload purge is performed to, for example, keep the interior of the carrier CA in an inert gas ($N_2$ gas) atmosphere until the next process after the carrier CA is unloaded from the present substrate processing apparatus.

The standby purge refers to an inert gas purge in which, during the time period from the load purge end timing to the unload purge start timing, namely during the standby time zone between the load purge time zone and the unload purge time zone, an inert gas (an $N_2$ gas) is injected and supplied from the purge gas supply nozzle 51 toward the interior of the carrier CA. The standby purge may be configured to continuously inject an inert gas (an $N_2$ gas) into the carrier CA. If necessary, the standby purge may be configured to intermittently inject an inert gas (an $N_2$ gas). By doing so, it is possible to save an inert gas (e.g., an $N_2$ gas).

Using an operation screen displayed on the operation display part 11s, an operator can set whether to give an $N_2$ gas purge function as a system, namely whether to make all the inert gas purges (the load purge, the standby purge and the unload purge) feasible, whether to give an $N_2$ gas purge function to a certain load port LP, whether to perform the load purge with respect to the respective load ports LP, whether to perform the standby purge and whether to perform the unload purge. If the load purge time, during which the load purge is performed, is set at a value other than 0 (zero), the load purge is performed for the time thus set. If the unload purge time, during which the unload purge is performed, is set at a value other than 0 (zero), the unload purge is performed for the time thus set. If the load purge time or the unload purge time is set at 0, the load purge or the unload purge is not performed.

The purge function setting data are inputted from the operation display part 11s, transmitted from the operation part controller 11 to the transfer system controller 13 and stored in the storage part 13m of the transfer system controller 13. The transfer system controller 13 performs gas purge control based on the purge function setting data stored in the storage part 13m.

As illustrated in FIG. 5, in the case of A, namely in the case where it is set so that (a) the $N_2$ gas purge function as a system is not available, the load purge, the standby purge and the unload purge are not performed regardless of (b) the presence or absence of the $N_2$ gas purge function of the load port LPn, (c) the presence or absence of load purge time setting, (d) the presence or absence of standby purge setting and (e) the presence or absence of unload purge time setting.

Furthermore, even in the case of B, namely even in the case where it is set so that (a) the $N_2$ gas purge function as a system is available, if it is set so that (b) the $N_2$ gas purge function of the load port LPn is not available, the load purge, the standby purge and the unload purge are not performed regardless of (c) the presence or absence of load purge time setting, (d) the presence or absence of standby purge setting and (e) the presence or absence of unload purge time setting.

Furthermore, in the case of C to F, namely in the case where it is set so that (a) the $N_2$ gas purge function as a system is available, (b) the $N_2$ gas purge function of the load port LPn is available and (c) the load purge time is 0 (zero), the following holds true. In the case of C, namely in the case where it is set so that (d) the standby purge is not available and (e) the unload purge time is 0 (zero), the load purge, the standby purge and the unload purge are not performed. In the case of D, namely in the case where it is set so that (d) the standby purge is not available and (e) the unload purge time is a value other than 0 (zero), the load purge and the standby purge are not performed and only the unload purge is performed for the time designated in FIG. 5.

In the case of E, namely in the case where it is set so that (d) the standby purge is available and (e) the unload purge time is 0 (zero), only the standby purge is performed. In the case of F, namely in the case where it is set so that (d) the standby purge is available and (e) the unload purge time is a value other than 0 (zero), the load purge is not performed and the standby purge and the unload purge are performed.

Furthermore, in the case of G to K, namely in the case where it is set so that (a) the $N_2$ gas purge function as a system is available, (b) the $N_2$ gas purge function of the load port LPn is available and (c) the load purge time is a value other than 0 (zero), the following holds true. In the case of G, namely in the case where it is set so that (d) the standby purge is not available and (e) the unload purge time is 0 (zero), only the load purge is performed. In the case of H, namely in the case where it is set so that (d) the standby purge is not available and (e) the unload purge time is a value other than 0 (zero), the standby purge is not performed and only the load purge and the unload purge are performed.

In the case of J, namely in the case where it is set so that (d) the standby purge is available and (e) the unload purge time is 0 (zero), the unload purge is not performed and the load purge and the standby purge are performed. In the case of K, namely in the case where it is set so that (d) the standby purge is available and (e) the unload purge time is a value other than 0 (zero), the load purge, the standby purge and the unload purge are performed.

If it is configured to perform only the load purge, for example, in the case where it is configured so that the atmospheric pressure transfer chamber EFEM of the present substrate processing apparatus is kept in an $N_2$ atmosphere during the process, by only performing the load purge, the wafers W are not exposed to the air atmosphere, namely oxygen or moisture existing in the atmosphere during the time period from the process processing performed after loading the carrier CA to the unloading of the carrier CA which accommodates processed wafers W. It is therefore possible to save the $N_2$ gas used in the purge processing.

If it is configured to perform only the unload purge, for example, in the case where the $N_2$ gas purge is not needed in the process performed by the present substrate processing apparatus and the next process performed by another processing device is a process performed in an $N_2$ atmosphere, the internal atmosphere of the carrier CA is substituted with an $N_2$ atmosphere by the $N_2$ gas purge processing immediately before the door of the carrier CA is closed. It is therefore possible to smoothly move to the next process in which the substrate processing is performed in an $N_2$ atmosphere.

If it is configured to perform only the standby purge, for example, in the case where the atmospheric pressure transfer chamber EFEM of the present substrate processing apparatus is configured to be in the air atmosphere, the loaded carrier CA is filled with an $N_2$ gas and the unloaded carrier CA need not be filled with an $N_2$ gas, it is possible to have the interior of the carrier CA mounted on the load port LP come closer to an $N_2$ atmosphere as compared with a configuration in which the standby purge is not performed. Thus, the wafers W are less exposed to the air atmosphere.

If it is configured to perform the load purge, the unload purge and the standby purge, for example, in the case where the atmospheric pressure transfer chamber EFEM of the present substrate processing apparatus is configured to be in the air atmosphere, it is possible to have the interior of the carrier CA mounted on the load port LP come closer to an $N_2$ atmosphere as compared with a configuration in which the load purge, the unload purge and the standby purge are not performed. Thus, the wafers W are less exposed to the air atmosphere.

In the present embodiment, in addition to the purge function illustrated in FIG. 5, it is possible to designate whether to perform $N_2$ gas purge with respect to the carrier CA mounted on the load port LP. Specifically, in the case where the present substrate processing apparatus is connected to a higher-level host, it is possible to set whether to purge, with an $N_2$ gas, the interior of the carrier CA mounted on the load port LP, by receiving the ID (identifier) of the carrier CA and the gas purge designation information, which designates whether to purge, with an $N_2$ gas, the carrier CA, from the higher-level host. In the case where the present substrate processing apparatus is not connected to the higher-level host, when authenticating the ID of the carrier CA mounted on the load port LP, it is possible for an operator to set whether to purge, with an $N_2$ gas, the interior of the carrier CA, using the operation screen displayed on the operation display part 11s. FIG. 6 is an example of a dialog screen used in authenticating the ID of the carrier CA.

In the example illustrated in FIG. 6, it is configured to merely set whether to purge, with an $N_2$ gas, the interior of the carrier CA mounted on the load port LP. However, the purging method may be configured so as to select and set one or more of the load purge, the standby purge and the unload purge.

The purge function setting data set on the dialog screen of FIG. 6 are transmitted from the operation part controller 11 to the transfer system controller 13 and are stored in the storage part 13m of the transfer system controller 13. The transfer system controller 13 performs gas purge control based on the purge function setting data stored in the storage part 13m.

As described above, in the present embodiment, the control part 10 executes control so as to select at least one inert gas purge from the load purge, the unload purge and the standby purge and to perform the inert gas purge thus selected. Furthermore, the control part 10 performs control so that the load purge, the unload purge and the standby purge are made feasible in the case where a first operation screen which receives an instruction as to whether to make all the inert gas purges feasible is displayed on the operation display part 11s and where an instruction of making all the inert gas purges feasible is received by the first operation screen. The load purge, the unload purge and the standby purge are made infeasible in the case where an instruction of making all the inert gas purges infeasible is received by the first operation screen.

Furthermore, the control part 10 executes control so that, if a second operation screen which receives an instruction of designating the carrier CA mounted on the load port LP, designating the load port LP or designating the carrier CA mounted on the load port LP and the load port LP, as a target specifying instruction of specifying a target carrier to be subjected to the inert gas purges, and a purge type instruction of designating the load purge, the unload purge and the standby purge to be performed for every target specifying instruction, is displayed on the operation display part 11s and if the target specifying instruction and the purge type instruction are received by the second operation screen, the inert gas purges are performed based on the target specifying instruction and the purge type instruction thus received. Depending on the information amount to be displayed, the first operation screen and the second operation screen may be the same screen or, if necessary, may be divided into a plurality of screens.

Next, an abnormality detecting operation and an abnormality processing operation related to the gas purges will be described in detail. As described above, the purge gas supply pipe 52 is connected to the purge gas supply part 50. The flow rate of an $N_2$ gas flowing through the purge gas supply pipe 52 is set by the pressure regulating valve 56. The threshold values (upper and lower limit values) of the internal pressure of the purge gas supply pipe 52 in the case where the interior of the carrier CA is not being purged with an $N_2$ gas, the threshold values (upper and lower limit values) of the internal pressure of the purge gas supply pipe 52 in the case where the interior of the carrier CA is being purged with an $N_2$ gas, and the threshold values (upper and lower limit values) of the $N_2$ gas flow rate within the purge gas supply pipe 52, are set by an operator through the operation display part 11s and are stored in the storage part 13m.

In the case where the interior of the carrier CA is not being purged with an $N_2$ gas, the transfer system controller 13 monitors whether the value of the pressure sensor 57 exceeds a predetermined threshold value. In the case where the interior of the carrier CA is being purged with an $N_2$ gas, the transfer system controller 13 monitors whether the value of the pressure sensor 57 exceeds a predetermined threshold value and whether the $N_2$ gas flow rate within the purge gas supply pipe 52 exceeds a predetermined threshold value. If the predetermined threshold value is exceeded, the transfer system controller 13 determines that an abnormality has occurred in the purge gas supply part 50.

In the case where the interior of the carrier CA is not being purged with an $N_2$ gas, namely in the case where the on-off valve 55 is closed, if the purge gas supply part 50 is normal, the value of the pressure sensor 57 falls within a predetermined range determined by the pressure from the purge gas supply source 58. If the purge gas supply part 50 becomes abnormal, for example, if the purge gas supply source 58 becomes abnormal, the pressure from the purge gas supply source 58 decreases. As a result, the pressure deviates from the pressure threshold value. The transfer system controller 13 determines that an abnormality has occurred in the purge gas supply part 50. The pressure threshold value is set such that, for example, the upper limit value is 0.3 MPa and the lower limit value is 0.1 MPa. In the case where the interior of the carrier CA is not being purged with an $N_2$ gas, the transfer system controller 13 may be configured to monitor, in addition to the pressure monitoring, whether the $N_2$ gas flow rate within the purge gas supply pipe 52 exceeds a pressure threshold value.

On the other hand, in the case where the interior of the carrier CA is being purged with an $N_2$ gas, namely in the case where the on-off valve 55 is opened, if the purge gas supply part 50 is normal, the value of the pressure sensor 57 falls within a predetermined range. If the purge gas supply part 50 becomes abnormal, the pressure value deviates from the predetermined range. Thus, it can be determined that the purge gas supply part 50 is abnormal. However, in the case where the purge gas supply part 50 becomes abnormal, it is difficult to make determination based on the pressure value because the $N_2$ gas is flowing through the purge gas supply pipe 52.

More specifically, in the case where the interior of the carrier CA is being purged with an $N_2$ gas, the value of the pressure sensor 57 is mainly decided by the pressure from the purge gas supply source 58, the internal pressure of the carrier CA as the injection destination of the $N_2$ gas (namely, the internal pressure of the atmospheric pressure transfer chamber EFEM) and the gas flow rate within the purge gas supply pipe 52. If the purge gas supply part 50 becomes abnormal, for example, if the purge gas supply source 58 becomes abnormal, the pressure from the purge gas supply source 58 decreases. If the pressure decreases, the $N_2$ gas flow rate is also reduced. Thus, the pressure is further reduced. For that reason, the pressure value is instable. This makes it difficult to decide a highly accurate threshold value. Accordingly, there may be a case where the purge gas supply part 50 is abnormal, even if the pressure falls within a threshold value range. As a result, it is difficult to perform the determination of an abnormality of the purge gas supply part 50 based on only the pressure threshold value. Thus, the abnormality determination relying on a flow rate threshold value and the abnormality determination relying on a pressure threshold value are performed together. For example, the flow rate threshold value is set such that the upper limit value is 300 slm and the lower limit value is 50 slm. The pressure threshold value is set such that the upper limit value is 0.3 MPa and the lower limit value is 0.05 MPa.

As described above, the pressure variation width indicated by the pressure sensor 57 is larger when the on-off valve 55 is opened than when the on-off valve 55 is closed. It is difficult to detect an abnormality of the purge gas supply part 50 by measuring the value of the pressure sensor 57. For that reason, in the present embodiment, the flow meter 54 is provided and the detection accuracy of an abnormality of the purge gas supply part 50 is enhanced by monitoring the flow rate within the purge gas supply pipe 52 using the flow meter 54.

FIG. 7 is a view illustrating an abnormality coping process in the control part 10 at the time of occurrence of an abnormality in the purge gas supply part or the like in an embodiment of the present disclosure. FIG. 7 shows the states of the load port LP and the processing pursuant to abnormality factors. As illustrated in FIG. 7, the states of the load port LP includes a carrier waiting state, a pre-door-opening state, a load purge ongoing state, a standby purge ongoing state, an unload purge ongoing state, a post-door-closing state and a post-carrier-unloading state.

The carrier waiting state refers to a state which is available before the carrier CA is mounted on the load port LP. The pre-door-opening state refers to a state which is available after the carrier CA is mounted on the load port LP and before the carrier door CAH is opened. The load purge ongoing state refers to a state in which the load purge is being performed after the carrier door CAH is opened. The standby purge ongoing state refers to a state in which the standby purge is being performed. The unload purge ongoing state refers to a state in which the unload purge is being performed. The post-door-closing state refers to a state which is available after the carrier door CAH is closed by completing the purge processing and before the carrier CA is unloaded from above the load port LP. The post-carrier-unloading state refers to a state which is available after the carrier CA is unloaded from above the load port LP.

The abnormality occurrence factors include a pressure abnormality, a flow rate abnormality, external interlock occurrence and purge switch turn-off. The pressure abnormality refers to an abnormality attributable to the excess or decrease of the pressure of the pressure sensor 57 installed in the purge gas supply pipe 52. The pressure abnormality is mainly generated by the abnormality of the purge gas supply source 58 which is an $N_2$ gas supply source. For example, if the pressure of the purge gas supply source 58 decreases under a gas purge non-executing state such as the carrier waiting state or the like or under a gas purge executing state such as the load purge ongoing state or the like, the pressure value indicated by the pressure sensor 57 deviates from the threshold value. Thus, the control part 10 determines that the purge gas supply part 50 suffers from a pressure abnormality.

The flow rate abnormality refers to an abnormality which is generated in the case where the flow rate indicated by the flow meter 54 installed in the purge gas supply pipe 52 exceeds a predetermined threshold value. The flow rate abnormality is mainly generated due to the pressure abnormality. For example, if the pressure of the purge gas supply source 58 is reduced under a gas purge executing state such as the load purge ongoing state or the like, the flow rate indicated by the flow meter 54 decreases and deviates from the threshold value. Thus, the control part 10 determines that the purge gas supply part 50 suffers from a flow rate abnormality. As described above, even when the pressure change is too small to detect a pressure abnormality, the abnormality detection accuracy can be improved by performing the flow rate monitoring.

The external interlock refers to an impediment adversely affecting the gas purge execution, such as the opening of a maintenance door of the atmospheric pressure transfer chamber EFEM or the like. The external interlock is mainly generated by an external factor which affects the substrate processing apparatus. The purge switch turn-off is generated in the case where an operator sets the purge switch 59 in an off-state.

In order to ensure that the processing is not performed in the process chamber PM when an abnormality is generated in the purge gas supply part 50, the control part 10 performs abnormal time processing as illustrated in FIG. 7 based on the states of the load port LP and the abnormality factors. That is to say, when processing the abnormality of the purge gas supply part 50, the control part 10 first confirms whether the state of the load port LP is the carrier waiting state, the pre-door-opening state, the load purge ongoing state, the standby purge ongoing state, the unload purge ongoing state, the post-door-closing state or the post-carrier-unloading state. Then, the control part 10 confirms whether the abnormality factor in the confirmed load port state is the pressure abnormality, the flow rate abnormality, the external interlock occurrence or the purge switch turn-off. Then, the control part 10 performs the processing illustrated in FIG. 7 according to the load port state and the abnormality factor thus confirmed.

First, descriptions will be made on a case where the abnormality factors are the external interlock occurrence and the purge switch turn-off. In this case, the abnormality occurrence factor is decided and the processing can be performed if the abnormality is removed. Accordingly, in order to make it possible to exclude the abnormality factor, the control part 10 basically performs a process by which the carrier CA is made dischargeable from the load port LP so that the carrier CA can be discharged from the load port LP.

At this time, if the carrier CA does not exist on the load port LP (the carrier waiting state or the post-carrier-unloading state), the control part 10 generates an alarm to notify an operator of the abnormality occurrence. Furthermore, at this time, if the carrier door CAH of the carrier CA mounted on the load port LP is closed (the pre-door-opening state or the post-door-closing state), the control part 10 makes it possible to discharge the carrier CA from the load port LP. Furthermore, at this time, if the state of the load port LP is the gas purge executing state (the load purge ongoing state, the standby purge ongoing state or the unload purge ongoing state), the control part 10 closes the carrier door CAH and then makes it possible to discharge the carrier CA from the load port LP. If the state of the load port LP is the standby purge ongoing state, the control part 10 returns all the wafers W to the carrier CA and makes it possible to discharge the carrier CA from the load port LP.

Next, descriptions will be made on a case where the abnormality factor is the pressure abnormality or the flow rate abnormality. In this case, if the state of the load port LP is the gas purge executing state, it is impossible to determine whether the $N_2$ gas purge for the carrier CA is normally completed. If the state of the load port LP is the gas purge non-executing state (the carrier waiting state, the pre-door-opening state, post-door-closing state or the post-carrier-unloading state), it is impossible to determine whether the $N_2$ gas purge for the next carrier CA is normally completed. Furthermore, in the case where the flow rate abnormality has occurred, it is impossible to know whether a necessary flow rate can be secured, unless the $N_2$ gas purge is performed again (it is impossible to know the flow rate, unless the $N_2$ gas is allowed to flow by opening the on-off valve 55). Therefore, it is not possible to continue the processing in the state as it stands.

Thus, in the case where the pressure abnormality or the flow rate abnormality has occurred, the carrier CA on the abnormality-occurring load port LP is made dischargeable. After the carrier CA is discharged, the control part 10 automatically shifts the abnormality-occurring load port LP to a maintenance mode. At this time, if the carrier CA does not exist on the abnormality-occurring load port LP (the carrier waiting state or the post-carrier-unloading state), the control part 10 automatically shifts the abnormality-occurring load port LP to the maintenance mode without awaiting the discharge of the carrier CA.

Furthermore, at this time, if the carrier door CAH of the carrier CA on the abnormality-occurring load port LP is closed (the pre-door-opening state or the post-door-closing state), the carrier CA is made dischargeable. After the carrier CA is discharged, the control part 10 automatically shifts the abnormality-occurring load port LP to the maintenance mode.

Furthermore, at this time, if the carrier CA on the abnormality-occurring load port LP is in the gas purge executing state (the load purge ongoing state, the standby purge ongoing state or the unload purge ongoing state), the carrier door CAH of the carrier CA is closed and the carrier CA is made dischargeable. After the carrier CA is discharged, the control part 10 automatically shifts the abnormality-occurring load port LP to the maintenance mode. If the state of the load port LP is the standby purge ongoing state, the carrier CA is made dischargeable from the abnormality-occurring load port LP after returning all the wafers W which are to be returned to the carrier CA on the abnormality-occurring load port LP.

After the abnormality-occurring load port LP is shifted to the maintenance mode, as long as an operator as a user does not switch the maintenance mode to a non-maintenance mode using the operation screen of the operation display part 11s, the control part 10 notifies the higher-level host computer of the maintenance mode so that the carrier CA is not automatically loaded on the load port LP. Furthermore, after the abnormality-occurring load port LP is shifted to the maintenance mode, the control part 10 performs control so that the wafers W existing within the carrier CA mounted on the load port LP connected to the purge gas supply part 50 determined to be abnormal are not processed in the process chamber PM. Accordingly, in the maintenance mode, there is not generated such a situation that the wafers W existing within the carrier CA mounted on the load port LP of an abnormal state are processed.

In the case where the pressure abnormality or the flow rate abnormality has occurred, as a means for confirming that the abnormality factor is removed and the substrate processing apparatus is restored to a normal state, there is no way but to perform an $N_2$ gas purge. If the $N_2$ gas purge is performed by switching the load port LP to the non-maintenance mode and automatically loading the carrier CA, it is possible to confirm that the substrate processing apparatus is restored to a normal state. However, if a flow rate abnormality occurs at that time, the load port LP is automatically shifted to the maintenance mode again. This is not efficient.

Thus, a test button for temporarily loading the carrier CA and performing the $N_2$ gas purge during the maintenance mode is provided on the operation screen of the operation display part 11s. If an operator pushes the test button, namely if the operation display part 11s receives a test execution instruction, the carrier door CAH of the carrier CA mounted on the load port LP kept in the maintenance mode is opened and the $N_2$ gas purge is performed for a predetermined test time. If a flow rate abnormality does not occur during the flow rate test time, the control part 10 determines that the load port LP is normal and usable.

Thereafter, if a non-maintenance mode shift instruction which instructs the switching to the non-maintenance mode is received from the operation screen of the operation display part 11s, the control part 10 is shifted to the non-maintenance mode because it has been determined in the flow rate test that the purge gas supply part 50 is normal. The non-maintenance mode refers to an ordinary production mode in which a substrate as a product is processed. Thus, the carrier CA is automatically loaded and the production can be resumed. In the case where it is determined in the flow rate test that the purge gas supply part 50 is abnormal, the control part 10 is not shifted to the non-maintenance mode even if the operation display part 11s receives a non-maintenance mode shift instruction.

According to the configuration described above, the control part 10 executes the process recipe stored in the storage part 14m of the process chamber controller 14, based on, e.g., the operator's instruction received from the operation display part 11s. The control part 10 performs control pursuant to the process recipe so that the flow rate of the process gas supplied to the process chambers PM1 to PM4, the internal pressure of the process chambers PM1 to PM4 and the temperature of the wafers W existing within the process chambers PM1 to PM4 become predetermined values. Furthermore, when executing the process recipe, the control part 10 performs control pursuant to the transfer recipe so that the wafers W are transferred by the atmospheric pressure robot AR and the vacuum robot VR between the carriers CA1 to CA3 on the load ports LP1 to LP3, the aligner AU, the load lock chambers LM1 to LM2 and the process chambers PM1 to PM4. In addition, the control part 10 performs control pursuant to the transfer recipe so that the interior of the carriers CA1 to CA3 mounted on the load ports LP1 to LP3 is purged with an $N_2$ gas.

(3) Substrate Processing Process

Next, descriptions will be made on one example of a substrate processing process which makes use of the substrate processing apparatus having the aforementioned configuration. This substrate processing process is performed as one process of e.g., a semiconductor manufacturing method for manufacturing a semiconductor device on a substrate. In the substrate processing process, the respective components of the substrate processing apparatus are controlled by the control part 10.

First, for example, the carrier CA1 which accommodates 25 unprocessed wafers is transferred to the substrate processing apparatus by an in-process transfer device. As illustrated in FIG. 1, the carrier CA1 thus transferred is delivered from the in-process transfer device and is mounted on, e.g., the load port LP1 (carrier loading). The ID (e.g., the barcode) of the carrier CA1 mounted on the load port LP1 is read and authenticated by an ID reading device (not illustrated). Thereafter, the carrier door CAH1 of the carrier CA1 is removed by the carrier opener CP. The load purge is performed for a predetermined time. In this example, the interior of the atmospheric pressure transfer chamber EFEM is kept in an air atmosphere. After the load purge is completed, the standby purge is started. In addition, the atmospheric pressure robot AR installed in the atmospheric pressure transfer chamber EFEM picks up one wafer W from the carrier CA1 and mounts the wafer W on the aligner AU.

The aligner AU adjusts the notch position of the wafer W by moving the mounted wafer W in the vertical, horizontal and circumferential directions on a horizontal plane. After the position adjustment of the wafer W is completed by the aligner AU, the atmospheric pressure robot AR picks up the wafer W mounted on the aligner AU. Then, the gate valve LD1 is opened. The atmospheric pressure robot AR loads the wafer W into the load lock chamber LM1 kept in the air atmosphere. During this loading work, the gate valve LGV1 existing at the side of the vacuum transfer chamber TM is closed and the negative pressure is maintained within the vacuum transfer chamber TM.

If the loading of the wafer W into the load lock chamber LM is completed, the gate valve LD1 is closed and the interior of the load lock chamber LM1 is evacuated by an exhaust device (not illustrated) so as to have a negative pressure. If the load lock chamber LM1 is depressurized to a predetermined pressure value, the gate valve LGV1 is opened. The vacuum robot VR of the vacuum transfer chamber TM picks up the wafer W from the interior of the load lock chamber LM1 and loads the wafer W into the vacuum transfer chamber TM. Thereafter, the gate valve LGV1 is closed and the gate valve PGV1 of the process chamber PM1 is opened. The vacuum robot VR loads the wafer W into the process chamber PM1. After the gate valve PGV1 is closed, a process gas is supplied from a gas supply device (not illustrated) into the process chamber PM1. Desired processing is performed to the wafer W. A semiconductor is formed on the wafer W.

After the processing of the wafer W is completed in the process chamber PM1, the gate valves PGV1 and LGV1 are opened. The vacuum robot VR unloads the wafer W from the process chamber PM1 and loads the wafer W into the load lock chamber LM1. Then, the gate valve LGV1 is closed and the cooling of the processed wafer W is started within the load lock chamber LM1. At the same time, an inert gas is introduced into the load lock chamber LM1 from an inert gas supply device (not illustrated) connected to the load lock chamber LM1. The internal pressure of the load lock chamber LM1 is returned to the atmospheric pressure.

In the load lock chamber LM1, if a predetermined cooling time is elapsed and if the internal pressure of the load lock chamber LM1 is returned to the atmospheric pressure, the gate valve LD1 is opened. Subsequently, the atmospheric pressure robot AR of the atmospheric pressure transfer chamber EFEM picks up the processed wafer W from the interior of the load lock chamber LM1 and unloads the processed wafer W to the atmospheric pressure transfer chamber EFEM. Then, the gate valve LD1 is closed. Thereafter, the atmospheric pressure robot AR brings the processed wafer W into the carrier CA1.

If the desired processing is performed to all the wafers W contained in the carrier CA1 by virtue of the aforementioned process and if the 25 processed wafers W are all accommodated within the carrier CA1, the standby purge is completed. After completing the standby purge, the unload purge is performed for a predetermined time. After completing the unload purge, the carrier door CAH1 of the carrier CA1 is closed. The closed carrier CA1 is taken out from above the load port LP1 by an in-process transfer device (carrier unloading) and is transferred to the next process. By repeating the above operations, 25 wafers are sequentially processed on a carrier-by-carrier basis. In this example, the standby purge is performed until just before the carrier door CAH1 is closed. Thus, the unload purge may be omitted.

According to the embodiment described above, it is possible to obtain at least the following effects (1) to (16). (1) By performing the inert gas purge in the load port, it is possible to shorten the time during which the substrate is exposed to the air atmosphere. This makes it possible to reduce the influence of impurities and moisture on the substrate. It is therefore possible to perform good substrate processing. (2) Since at least one inert gas purge can be selected from the load purge, the unload purge and the standby purge, it is possible to perform an appropriate inert gas purge depending on the substrate processing content. (3) Since the first operation screen which receives an instruction as to whether to make all the inert gas purges (the load purge, the unload purge and the standby purge) feasible is displayed on the operation display part, it is possible for an operator to easily set whether to make all the inert gas purges feasible. (4) Inasmuch as the second operation screen which receives an instruction of designating the carrier, designating the load port or designating the carrier and the load port, as an inert gas purge target specifying instruction, and a purge type instruction of designating the load purge, the unload purge and the standby purge to be performed for every target specifying instruction, is displayed on the operation display part, it is possible for an operator to easily execute the specifying of the inert gas purge target and the setting of the purge type. (5) Even in the case of the load port whose atmosphere leads to the atmospheric pressure transfer chamber kept in an air atmosphere, if the unload purge is performed, it is possible to smoothly move to the next process in which the substrate processing is performed in an environment other than the air atmosphere. (6) In the case where the load purge is performed in the load port whose atmosphere leads to the atmospheric pressure transfer chamber kept in an inert atmosphere, it is possible to restrain the wafers W from being exposed to the air atmosphere during the time period from the process processing performed after loading the carrier to the unloading of the carrier which accommodates processed wafers W. (7) Even in the case of the load port whose atmosphere leads to the atmospheric pressure transfer chamber kept in an air atmosphere, if the standby purge is performed, it is possible to restrain the wafers W from being exposed to the air atmosphere during the time period from the process processing performed after loading the carrier to the unloading of the carrier which accommodates processed wafers W. (8) Even in the case of the load port whose atmosphere leads to the atmospheric pressure transfer chamber kept in an air atmosphere, if the load purge, the standby purge and the unload purge are performed, it is possible to restrain the wafers W from being exposed to the air atmosphere during the time period from the process processing performed after loading the carrier to the unloading of the carrier which accommodates processed wafers W. (9) In the case where it is configured so that the standby purge is intermittently performed, it is possible to save the purge gas. (10) By installing the pressure sensor and the flow meter in the purge gas supply pipe and monitoring the pressure detected by the pressure sensor and the flow rate measured by the flow meter, it is possible to determine whether the purge gas supply part is abnormal. (11) Since the abnormality of the purge gas supply part is monitored depending on the pressure state when the inert gas purge is not underway and the abnormality of the purge gas supply part is monitored depending on the pressure state and the flow rate state when the inert gas purge is underway, it is possible to accurately determine the abnormality of the purge gas supply part. (12) If the purge switch is set in an off-state or if the external interlock occurs, it is determined that the purge gas supply part is abnormal. It is therefore possible to cope with the purge switch turn-off and the external interlock occurrence.

(13) In the case where the purge gas supply part is abnormal, it is automatically shifted to the maintenance mode in which the substrate processing in the process chamber is not performed with respect to the substrates existing within the carrier mounted on the abnormality-occurring load port. This makes it possible to suppress generation of substrate defects. At this time, if the substrate is not being processed at the time point at which the abnormality of the purge gas supply part is detected, it is immediately shifted to the maintenance mode. If the substrate is being processed, it is shifted to the maintenance mode after the substrate is completely processed and returned to the carrier. (14) In the case where the purge gas supply part is abnormal, the carrier door of the carrier mounted on the abnormality-occurring load port is closed and the carrier is made dischargeable. This makes it easy to perform the maintenance. At this time, if the substrate is not being processed at the time point at which the abnormality of the purge gas supply part is detected, the carrier door is immediately closed and the carrier is made dischargeable. If the substrate is being processed, the carrier door is closed and the carrier is made dischargeable after the substrate is completely processed and returned to the carrier.

(15) In the maintenance mode, if the operation display part receives a test execution instruction, a flow rate test in which an inert gas is caused to flow through the purge gas supply pipe for a predetermined test time is executed. In the case where the flow rate measured during the test time does not deviate from a predetermined threshold value, it is determined that the purge gas supply part is normal. It is therefore possible to efficiently determine whether the purge gas supply part is normal. (16) In the maintenance mode, if the operation display part receives a non-maintenance mode shift instruction, it is shifted to a non-maintenance mode in the case where it is determined in the flow rate test that the purge gas supply part is normal. It is therefore possible to efficiently perform the return to the non-maintenance mode.

The present disclosure is not limited to the aforementioned embodiment. It goes without saying that the present disclosure may be differently modified without departing from the spirit thereof.

In the aforementioned embodiment, the atmospheric pressure transfer chamber EFEM is connected to the load port LP, the load lock chamber LM is connected to the atmospheric pressure transfer chamber EFEM, the vacuum transfer chamber TM is connected to the load lock chamber LM, and the process chamber PM is connected to the vacuum transfer chamber TM. However, the present disclosure is not limited thereto and may be applied to, for example, a case where the process chamber PM is connected to the atmospheric pressure transfer chamber EFEM.

Furthermore, in the aforementioned embodiment, the control of the purge gas supply part is performed by the transfer system controller 13. However, the present disclosure is not limited thereto and may be configured so that, for example, a purge gas supply control part for controlling the purge gas supply part is installed within the control part 10 independently of the transfer system controller 13.

Furthermore, in the aforementioned embodiment, the control part 10 is configured so as to select one or more gas purges from the load purge, the standby purge and the unload purge. However, the present disclosure is not limited thereto and may be configured so that, for example, the control part 10 fixes and performs one or more gas purges among the load purge, the standby purge and the unload purge.

Furthermore, in the aforementioned embodiment, if the control part 10 detects a pressure abnormality or a flow rate abnormality, the abnormality-occurring load port LP is automatically shifted to the maintenance mode. However, the present disclosure is not limited thereto and may be configured so that, for example, if the control part 10 detects a pressure abnormality or a flow rate abnormality, the information indicating the occurrence of the pressure abnormality or the flow rate abnormality and the information specifying the abnormality-occurring load port LP are displayed on the operation display part 11s and the abnormality-occurring load port LP is shifted to the maintenance mode according to the operator's instruction transmitted from the operation display part 11s.

The present disclosure may be applied to not only the semiconductor manufacturing device but also a glass substrate processing apparatus such as an LCD manufacturing device or the like and other substrate processing apparatuses. The content of substrate processing may be CVD, PVD, ALD or a deposition process for forming an epitaxial growth film, an oxide film, a nitride film, a metal-containing film or the like, and may be an annealing process, an oxidizing process, a diffusing process, an etching process, an exposure process, a lithography, a coating process, a molding process, a developing process, a dicing process, a wire bonding process, an inspection process or the like.

Hereinafter, some preferred aspects of the present disclosure will be described as supplementary notes.

(Supplementary Note 1)

According to one aspect of the present disclosure, there is provided a substrate processing apparatus including:

a process chamber configured to process a substrate;

a carrier mounting part configured to mount a carrier which accommodates the substrate, the substrate capable of being brought into and out of the carrier when a door of the carrier mounted on the carrier mounting part is opened;

a carrier opener configured to open and close the door of the carrier mounted on the carrier mounting part;

a purge gas supply part configured to supply an inert gas into the carrier with the door kept opened; and a control part configured to perform control so as to carry out at least one inert gas purge among a load purge which is an inert gas purge in which the inert gas is supplied from the purge gas supply part into the carrier for a predetermined time after the door of the carrier is opened by the carrier opener, an unload purge which is an inert gas purge in which the inert gas is supplied from the purge gas supply part into the carrier for a predetermined time after the substrate processed in the process chamber is accommodated within the carrier and before the door is closed, and a standby purge which is an inert gas purge in which the inert gas is supplied from the purge gas supply part into the carrier during a standby time zone between a time zone of the load purge and a time zone of the unload purge.

(Supplementary Note 2)

Preferably, there is provided the substrate processing apparatus of Supplementary Note 1, further including:

an operation display part, wherein a first operation screen which receives an instruction as to whether to make the inert gas purge feasible is displayed on the operation display part, the control part performs control so as to make at least one designated purge of the load purge, the unload purge and the standby purge feasible if the first operation screen receives an instruction of making the inert gas purge feasible, and the control part performs control so as to make at least one designated purge of the load purge, the unload purge and the standby purge infeasible if the first operation screen receives an instruction of making the inert gas purge infeasible.

(Supplementary Note 3)

Preferably, there is provided the substrate processing apparatus of Supplementary Note 2, wherein a second operation screen which receives an instruction of designating the carrier mounted on the carrier mounting part, designating the carrier mounting part or designating the carrier mounted on the carrier mounting part and the carrier mounting part, as a target specifying instruction of specifying a target carrier to be subjected to the inert gas purge, and a purge type instruction of designating the load purge, the unload purge and the standby purge to be performed for every target specifying instruction, is displayed on the operation display part, and if the second operation screen receives the target specifying instruction and the purge type instruction, the control part performs control so as to carry out the inert gas purge based on the target specifying instruction and the purge type instruction thus received.

(Supplementary Note 4)

Preferably, there is provided the substrate processing apparatus of Supplementary Note 1, further including:

an atmospheric pressure transfer chamber installed adjacent to the carrier mounting part through the carrier opener and provided with a substrate transfer machine configured to transfer the substrate in an air atmosphere, wherein the control part performs control so as to carry out the unload purge.

(Supplementary Note 5)

Preferably, there is provided the substrate processing apparatus of Supplementary Note 1, further including:

an atmospheric pressure transfer chamber installed adjacent to the carrier mounting part through the carrier opener and provided with a substrate transfer machine configured to transfer the substrate in an air atmosphere, wherein the control part performs control so as to carry out the load purge.

(Supplementary Note 6)

Preferably, there is provided the substrate processing apparatus of Supplementary Note 1, further including:

an atmospheric pressure transfer chamber installed adjacent to the carrier mounting part through the carrier opener and provided with a substrate transfer machine configured to transfer the substrate in an air atmosphere, wherein the control part performs control so as to carry out the standby purge.

(Supplementary Note 7)

Preferably, there is provided the substrate processing apparatus of Supplementary Note 1, further including:

an atmospheric pressure transfer chamber installed adjacent to the carrier mounting part through the carrier opener and provided with a substrate transfer machine configured to transfer the substrate in an air atmosphere, wherein the control part performs control so as to carry out all of the load purge, the unload purge and the standby purge.

(Supplementary Note 8)

Preferably, there is provided the substrate processing apparatus of Supplementary Note 1, wherein in the standby purge, the control part performs control so as to intermittently supply the inert gas from the purge gas supply part into the carrier.

(Supplementary Note 9)

Preferably, there is provided the substrate processing apparatus of Supplementary Note 1, wherein the purge gas supply part includes a purge gas supply pipe configured to supply the purge gas into the carrier mounted on the carrier mounting part, a pressure sensor configured to detect a gas pressure within the purge gas supply pipe and a flow meter configured to measure a gas flow rate within the purge gas supply pipe are installed in the purge gas supply pipe, and the control part is configured to determine that the purge gas supply part is abnormal if the pressure detected by the pressure sensor deviates from a predetermined threshold value or if the flow rate measured by the flow meter deviates from a predetermined threshold value.

(Supplementary Note 10)

Preferably, there is provided the substrate processing apparatus of Supplementary Note 9, wherein a purge switch configured to set whether to make the inert gas purge feasible with respect to the carrier mounted on the carrier mounting part is provided in a corresponding relationship with the carrier mounting part, and the control part is configured to determine that the purge gas supply part is abnormal if the purge switch is set in an off-state or if external interlock which becomes an obstacle in carrying out the inert gas purge occurs.

(Supplementary Note 11)

Preferably, there is provided the substrate processing apparatus of Supplementary Note 9, wherein the control part is configured to determine that the purge gas supply part is abnormal if the pressure detected by the pressure sensor deviates from the predetermined threshold value in a state in which the inert gas purge is not being performed.

(Supplementary Note 12)

Preferably, there is provided the substrate processing apparatus of Supplementary Note 9, wherein the control part is configured to determine that the purge gas supply part is abnormal if the pressure detected by the pressure sensor deviates from the predetermined threshold value and the flow rate measured by the flow meter deviates from the predetermined threshold value in a state in which the inert gas purge is being performed.

(Supplementary Note 13)

Preferably, there is provided the substrate processing apparatus of Supplementary Note 9, further including:

an operation display part, wherein if the pressure detected by the pressure sensor deviates from the predetermined threshold value or if the flow rate measured by the flow meter deviates from the predetermined threshold value, the control part determines that the purge gas supply part is abnormal and switches into a maintenance mode in which the processing within the process chamber is not performed with respect to the substrate existing within the carrier mounted on the carrier mounting part connected to the purge gas supply part determined to be abnormal, if a test execution instruction of instructing the supply of the inert gas into the carrier mounted on the carrier mounting part is received from the operation display part in the maintenance mode, the control part executes a test in which the inert gas is caused to flow through the purge gas supply pipe for a predetermined test time, and if the flow rate measured by the flow meter during the test time does not deviate from the predetermined threshold value, the control part determines that the purge gas supply part is normal.

(Supplementary Note 14)

Preferably, there is provided the substrate processing apparatus of Supplementary Note 13, wherein the operation display part is capable of receiving a non-maintenance mode shift instruction of instructing shift to a non-maintenance mode in which the processing within the process chamber is performed, and if the operation display part receives the non-maintenance mode shift instruction after the test is executed, the control part is shifted to the non-maintenance mode in the case where it is determined in the test that the purge gas supply part is normal.

(Supplementary Note 15)

Preferably, there is provided the substrate processing apparatus of Supplementary Note 1, wherein if it is determined that the purge gas supply part is abnormal, the control part is configured to switch into a maintenance mode in which the processing within the process chamber is not performed with respect to the substrate existing within the carrier mounted on the carrier mounting part connected to the purge gas supply part determined to be abnormal.

(Supplementary Note 16)

Preferably, there is provided the substrate processing apparatus of Supplementary Note 1, wherein if it is determined that the purge gas supply part is abnormal when the inert gas purge is being performed, the control part is configured to close the door of the carrier mounted on the carrier mounting part connected to the purge gas supply part determined to be abnormal and to make the carrier having the closed door dischargeable from the carrier mounting part.

(Supplementary Note 17)

Preferably, there is provided the substrate processing apparatus of Supplementary Note 1, further including:

an operation display part capable of receiving a maintenance mode shift instruction of instructing shift to a maintenance mode in which the processing within the process chamber is not performed and a non-maintenance mode shift instruction of instructing shift to a non-maintenance mode in which the processing within the process chamber is performed, wherein the control part is shifted to the maintenance mode if the operation display part receives the maintenance mode shift instruction, and is shifted to the non-maintenance mode if the operation display part receives the non-maintenance mode shift instruction.

(Supplementary Note 18)

According to another aspect of the present disclosure, there is provided a gas-purging method including:

a door opening process of opening a door of a carrier which accommodates a substrate;

a designation process of designating at least one inert gas purge among a load purge which is an inert gas purge in which an inert gas is supplied into the carrier for a predetermined time after the door is opened in the door opening process, an unload purge which is an inert gas purge in which the inert gas is supplied into the carrier for a predetermined time after a processed substrate is accommodated within the carrier and before the door is closed, and a standby purge which is an inert gas purge in which the inert gas is supplied into the carrier during a standby time zone between a time zone of the load purge and a time zone of the unload purge; and a supply process of supplying the inert gas into the carrier by carrying out the inert gas purge designated in the designation process.

(Supplementary Note 19)

According to another aspect of the present disclosure, there is provided a method for manufacturing a semiconductor device, including:

a door opening process of opening a door of a carrier which accommodates a substrate;

a designation process of designating at least one inert gas purge among a load purge which is an inert gas purge in which an inert gas is supplied into the carrier for a predetermined time after the door is opened in the door opening process, an unload purge which is an inert gas purge in which the inert gas is supplied into the carrier for a predetermined time after a substrate processed in a process chamber for performing substrate processing is accommodated within the carrier and before the door is closed, and a standby purge which is an inert gas purge in which the inert gas is supplied into the carrier during a standby time zone between a time zone of the load purge and a time zone of the unload purge;

a supply process of supplying the inert gas into the carrier by carrying out the inert gas purge designated in the designation process;

a processing process of loading the substrate from the carrier into the process chamber and processing the substrate within the process chamber; and a substrate accommodating process of unloading the processed substrate from an interior of the process chamber and accommodating the processed substrate within the carrier.

(Supplementary Note 20)

According to another aspect of the present disclosure, there is provided an abnormality processing method including:

a mounting step of mounting a carrier, which accommodates a substrate, on a carrier mounting part;

a door opening step of opening a door of the carrier mounted on the carrier mounting part;

a designation step of designating at least one inert gas purge among a load purge which is an inert gas purge in which an inert gas is supplied into a carrier for a predetermined time immediately after the door is opened at the door opening step, an unload purge which is an inert gas purge in which the inert gas is supplied into the carrier for a predetermined time after a processed substrate is accommodated within the carrier mounted on the carrier mounting part and immediately before the door is closed, and a standby purge which is an inert gas purge in which the inert gas is supplied into the carrier during a standby time zone between a time zone of the load purge and a time zone of the unload purge;

a supply step of supplying the inert gas from a purge gas supply pipe into the carrier by carrying out the inert gas purge designated at the designation step;

a step of, at the supply step, detecting a gas pressure within the purge gas supply pipe by a pressure sensor installed in the purge gas supply pipe and measuring a gas flow rate within the purge gas supply pipe by a flow meter installed in the purge gas supply pipe; and an abnormality determination step of determining that an abnormality has occurred if the pressure detected by the pressure sensor deviates from a predetermined threshold value or if the flow rate measured by the flow meter deviates from a predetermined threshold value.

(Supplementary Note 21)

According to another aspect of the present disclosure, there is provided an abnormality processing program including:

a designation step of designating at least one inert gas purge among a load purge which is an inert gas purge in which an inert gas is supplied into a carrier for a predetermined time after a door of the carrier for accommodating a substrate is opened, an unload purge which is an inert gas purge in which the inert gas is supplied into the carrier for a predetermined time after a processed substrate is accommodated within the carrier and before the door is closed, and a standby purge which is an inert gas purge in which the inert gas is supplied into the carrier during a standby time zone between a time zone of the load purge and a time zone of the unload purge;

a supply step of supplying the inert gas from a purge gas supply pipe into the carrier by carrying out the inert gas purge designated at the designation step;

a step of, at the supply step, detecting a gas pressure within the purge gas supply pipe by a pressure sensor installed in the purge gas supply pipe and measuring a gas flow rate within the purge gas supply pipe by a flow meter installed in the purge gas supply pipe; and an abnormality determination step of determining that an abnormality has occurred if the pressure detected by the pressure sensor deviates from a predetermined threshold value or if the flow rate measured by the flow meter deviates from a predetermined threshold value.

(Supplementary Note 22)

According to another aspect of the present disclosure, there is provided a recording medium which stores an abnormality-processing program including:

a designation step of designating at least one inert gas purge among a load purge which is an inert gas purge in which an inert gas is supplied into a carrier for a predetermined time after a door of the carrier for accommodating a substrate is opened, an unload purge which is an inert gas purge in which the inert gas is supplied into the carrier for a predetermined time after a processed substrate is accommodated within the carrier and until the door is closed, and a standby purge which is an inert gas purge in which the inert gas is supplied into the carrier during a standby time zone between a time zone of the load purge and a time zone of the unload purge;

a supply step of supplying the inert gas from a purge gas supply pipe into the carrier by carrying out the inert gas purge designated at the designation step;

a step of, at the supply step, detecting a gas pressure within the purge gas supply pipe by a pressure sensor installed in the purge gas supply pipe and measuring a gas flow rate within the purge gas supply pipe by a flow meter installed in the purge gas supply pipe; and an abnormality determination step of determining that an abnormality has occurred if the pressure detected by the pressure sensor deviates from a predetermined threshold value or if the flow rate measured by the flow meter deviates from a predetermined threshold value.

(Supplementary Note 23)

According to another aspect of the present disclosure, there is provided an abnormality processing method including:

a mounting step of mounting a carrier, which accommodates a substrate, on a carrier mounting part;

a door opening step of opening a door of the carrier mounted on the carrier mounting part;

a supply step of supplying an inert gas from a purge gas supply pipe into the carrier having the door opened at the door opening step;

a step of, at the supply step, detecting a gas pressure within the purge gas supply pipe by a pressure sensor installed in the purge gas supply pipe and measuring a gas flow rate within the purge gas supply pipe by a flow meter installed in the purge gas supply pipe; and an abnormality determination step of determining that an abnormality has occurred if the pressure detected by the pressure sensor deviates from a predetermined threshold value or if the flow rate measured by the flow meter deviates from a predetermined threshold value.

(Supplementary Note 24)

According to another aspect of the present disclosure, there is provided a substrate processing apparatus including:

a process chamber configured to process a substrate;

a carrier mounting part configured to mount a carrier which accommodates the substrate, the substrate capable of being brought into and out of the carrier when a door of the carrier mounted on the carrier mounting part is opened;

a carrier opener configured to open and close the door of the carrier mounted on the carrier mounting part;

a purge gas supply part configured to supply an inert gas into the carrier with the door kept opened, the purge gas supply part including a purge gas supply pipe configured to supply the purge gas into the carrier mounted on the carrier mounting part;

a pressure sensor installed in the purge gas supply pipe and configured to detect a gas pressure within the purge gas supply pipe;

a flow meter installed in the purge gas supply pipe and configured to measure a gas flow rate within the purge gas supply pipe; and a control part configured to determine that the purge gas supply part is abnormal if the pressure detected by the pressure sensor deviates from a predetermined threshold value or if the flow rate measured by the flow meter deviates from a predetermined threshold value.

This application is based upon and claims the benefit of priority from Japan Patent Applications No. 2013-143683, filed on Jul. 9, 2013, the entire disclosures of which are incorporated herein by reference.

INDUSTRIAL USE OF THE PRESENT INVENTION

The present disclosure is applied to a technique of suppressing the exposure to an air atmosphere of substrates accommodated within a substrate accommodating container loaded into a substrate processing apparatus which processes the substrates. The present disclosure may be applied to not only the semiconductor manufacturing device but also a glass substrate processing apparatus such as an LCD manufacturing device or the like and other substrate processing apparatuses.

EXPLANATION OF REFERENCE NUMERALS

10: control part (controller), 11: operation part controller, 11s: operation display part, 11m: storage part, 13: transfer system controller, 13m: storage part, 14: process chamber controller, 14m: storage part, 15: pressure controller, 16: switching hub, 17: sequencer, 18: SW digital I/O, 19: valve digital I/O, 20: storage part, 21: communication part, 31: network, 32: signal line, 40: higher-level host, 50: purge gas supply part, 51: purge gas supply nozzle, 51a: purge gas supply hole, 52: purge gas supply pipe, 53: filter, 54: flow meter (MFM), 55: on-off valve, 56: pressure regulating valve, 57: pressure sensor, 58: purge gas supply source, 59: purge switch. AU: aligner, AR: atmospheric pressure robot, ARA: atmospheric pressure robot arm, CA1 to CA3: carrier (accommodating container), CAA1 to CAA3: substrate loading/unloading port, CAH1 to CAH3: carrier door, CL: clean air unit, CP1 to CP3: carrier opener, CPD1 to CPD3: drive mechanism, CPH1 to CPH3: closure, EFEM: atmospheric pressure transfer chamber, LD1 or LD2: gate valve, LGV1 or LGV2: gate valve, LM1 or LM2: load lock chamber (spare chamber), LP1 to LP3: load port (carrier mounting part), PG1 to PG4: gate valve, PM1 to PM4: process chamber, TM: vacuum transfer chamber, VR: vacuum robot, VRA: vacuum robot arm, W: wafer

What is claimed is:

1. A substrate processing apparatus comprising:
a process chamber configured to process a substrate;
a carrier mounting part configured to mount a carrier which accommodates the substrate, the substrate capable of being brought into and out of the carrier when a door of the carrier mounted on the carrier mounting part is opened;
a carrier opener configured to open and close the door of the carrier mounted on the carrier mounting part;
a purge gas supply part configured to supply an inert gas into the carrier with the door kept opened; and
a controller configured to control the purge gas supply part so as to carry out at least one inert gas purge among
a load purge in which the inert gas is supplied from the purge gas supply part into the carrier for a first predetermined time after the door of the carrier is opened by the carrier opener,
an unload purge in which the inert gas is supplied from the purge gas supply part into the carrier for a second predetermined time after the substrate processed in the process chamber is accommodated within the carrier and before the door is closed, and
a standby purge in which the inert gas is supplied from the purge gas supply part into the carrier during a standby time zone between a time zone of the load purge and a time zone of the unload purge,
the controller being further configured to, when determining that the purge gas supply part is abnormal, perform abnormality processing based on a state of the carrier mounting part and an abnormality factor, without processing the substrate existing within the carrier mounted on the carrier mounting part connected to the purge gas supply part determined to be abnormal, and
wherein the purge gas supply part includes:
a purge gas supply pipe configured to supply the inert gas into the carrier mounted on the carrier mounting part,
a pressure sensor configured to detect a gas pressure within the purge gas supply pipe and a flow meter configured to measure a gas flow rate within the purge gas supply pipe are installed in the purge gas supply pipe, and
the controller is configured to determine that the purge gas supply part is abnormal if a pressure detected by the pressure sensor deviates from a first predetermined threshold value or if a flow rate measured by the flow meter deviates from a second predetermined threshold value.

2. The substrate processing apparatus of claim 1, wherein a purge switch configured to set whether to make the inert gas purge feasible with respect to the carrier mounted on the carrier mounting part is provided in a corresponding relationship with the carrier mounting part, and the controller is configured to determine that the purge gas supply part is abnormal if the purge switch is set in an off-state or if external interlock which becomes an obstacle in carrying out the inert gas purge occurs.

3. The substrate processing apparatus of claim 1, wherein the controller is configured to determine that the purge gas supply part is abnormal if the pressure detected by the pressure sensor deviates from the first predetermined threshold value in a state in which the inert gas purge is not being performed.

4. The substrate processing apparatus of claim 1, wherein the controller is configured to determine that the purge gas supply part is abnormal if the pressure detected by the pressure sensor deviates from the first predetermined threshold value and the flow rate measured by the flow meter deviates from the second predetermined threshold value in a state in which the inert gas purge is being performed.

5. The substrate processing apparatus of claim 1, wherein if it is determined that the purge gas supply part is abnormal when the inert gas purge is being performed, the controller is configured to close the door of the carrier mounted on the carrier mounting part connected to the purge gas supply part determined to be abnormal and to make the carrier having the closed door dischargeable from the carrier mounting part.

6. The substrate processing apparatus of claim 1, further comprising:

an atmospheric pressure transfer chamber installed adjacent to the carrier mounting part through the carrier opener and provided with a substrate transfer machine configured to transfer the substrate in an air atmosphere, wherein the controller performs control so as to carry out all of the load purge, the unload purge and the standby purge.

7. The substrate processing apparatus of claim 1, further comprising: an atmospheric pressure transfer chamber installed adjacent to the carrier mounting part through the carrier opener and provided with a substrate transfer machine configured to transfer the substrate in an air atmosphere, wherein the controller performs control so as to carry out all of the load purge, the unload purge and the standby purge.

8. The substrate processing apparatus of claim 1, wherein, in the standby purge, the controller is configured to perform control so as to intermittently supply the inert gas from the purge gas supply part into the carrier.

9. The substrate processing apparatus of claim 1, wherein the controller is further configured to:

determine whether the abnormality factor is one of a pressure abnormality, a flow rate abnormality, external interlock occurrence, and purge switch turn-off;

in response to determining that the abnormality factor is the external interlock occurrence or the purge switch turn-off, make the carrier dischargeable from the carrier mounting part to exclude the abnormality factor; and in response to determining that the abnormality factor is the pressure abnormality or the flow rate abnormality, switch the carrier mounting part into a maintenance mode after discharging the carrier from the carrier mounting part.

10. The substrate processing apparatus of claim 9, wherein the controller is further configured to notify a host computer of the maintenance mode, in which the carrier is not loaded onto the carrier mounting part, and the substrate existing within the carrier mounted on the carrier mounting part in an abnormal state is not processed.

11. The substrate processing apparatus of claim 9, further comprising an operation display part including a button for loading the carrier and testing the at least one inert gas purge, wherein the controller is further configured to, after the operation display part receives a test execution instruction, open the door of the carrier mounted on the carrier mounting part; perform the at least one inert gas purge for a third predetermined time; and, in response to determining that abnormality does not occur during the third predetermined time, determine that the carrier mounting part is usable, and wherein the controller is further configured to, after the operation display part receives a non-maintenance mode shift instruction, shift from the maintenance mode to a non-maintenance mode, in which the processing within the process chamber is performed.

12. The substrate processing apparatus of claim 11, wherein the operation display part is configured to further display a second operation screen which receives a target specifying instruction of specifying a target carrier to be subjected to the inert gas purge, and a purge type instruction of designating the load purge, the unload purge, and the standby purge to be performed for every target specifying instruction, after the second operation screen receives the target specifying instruction and the purge type instruction, the controller performs control so as to carry out the inert gas purge based on the target specifying instruction and the purge type instruction.

13. The substrate processing apparatus of claim 12, wherein the second operation screen is configured so that an instruction of designating the carrier mounted on the carrier mounting part, designating the carrier mounting part, or designating the carrier mounting part and the carrier mounted on the carrier mounting part is designated as the target specifying instruction.

14. The substrate processing apparatus of claim 1, wherein the state of the carrier mounting part is selected from a group consisting of a carrier waiting state, a pre-door-opening state, a load purge ongoing state, a standby purge ongoing state, an unload purge ongoing state, a post-door-closing state, and a post-carrier-unloading state.

* * * * *